US012091497B2

(12) United States Patent
Goto et al.

(10) Patent No.: US 12,091,497 B2
(45) Date of Patent: Sep. 17, 2024

(54) COMPOSITION FOR FORMING UNDERLAYER FILM FOR IMPRINTING, METHOD FOR PRODUCING COMPOSITION FOR FORMING UNDERLAYER FILM FOR IMPRINTING, PATTERN PRODUCING METHOD, METHOD FOR MANUFACTURING SEMICONDUCTOR ELEMENT, CURED PRODUCT, AND KIT

(71) Applicant: FUJIFILM Corporation, Tokyo (JP)

(72) Inventors: Yuichiro Goto, Shizuoka (JP); Akihiro Hakamata, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 384 days.

(21) Appl. No.: 17/211,843

(22) Filed: Mar. 25, 2021

(65) Prior Publication Data

US 2021/0206910 A1 Jul. 8, 2021

Related U.S. Application Data

(63) Continuation of application No. PCT/JP2019/037199, filed on Sep. 24, 2019.

(30) Foreign Application Priority Data

Sep. 28, 2018 (JP) ................................ 2018-185117

(51) Int. Cl.
*C08G 61/04* (2006.01)
*C08F 222/10* (2006.01)
(Continued)

(52) U.S. Cl.
CPC ........ *C08G 61/04* (2013.01); *C08F 222/1025* (2020.02); *C08K 3/08* (2013.01);
(Continued)

(58) Field of Classification Search
None
See application file for complete search history.

(56) References Cited

U.S. PATENT DOCUMENTS 9,507,263 B2 11/2016 Kodama et al.
9,796,803 B2 10/2017 Kitagawa et al.
(Continued)

FOREIGN PATENT DOCUMENTS

JP 2013093552 5/2013
JP 2014024322 2/2014
(Continued)

OTHER PUBLICATIONS

"Office Action of Japan Counterpart Application" with English translation thereof, issued on Nov. 16, 2021, p1-p6.
(Continued)

*Primary Examiner* — Robert J Grun
(74) *Attorney, Agent, or Firm* — JCIPRNET

(57) ABSTRACT

Provided are a composition for forming an underlayer film for imprinting, including a curable component, and a particulate metal which has a particle diameter of 10 nm or larger, as measured by a single particle ICP-MASS method, and contains at least one kind of iron, copper, titanium, or lead, in which a content of the particulate metal is 50 ppt by mass to 10 ppb by mass with respect to the composition; a method for producing a composition for forming an underlayer film for imprinting; a pattern producing method; a method for manufacturing a semiconductor element; a cured product; and a kit.

23 Claims, 1 Drawing Sheet

(51) Int. Cl.

| | |
|---|---|
| *C08K 3/08* | (2006.01) |
| *G03F 7/00* | (2006.01) |
| *H01L 21/027* | (2006.01) |

(52) U.S. Cl.

CPC ........ *G03F 7/0002* (2013.01); *H01L 21/0271* (2013.01); *C08K 2201/003* (2013.01); *C08K 2201/011* (2013.01)

(56) References Cited

U.S. PATENT DOCUMENTS

| | | | |
|---|---|---|---|
| 10,073,341 | B2 | 9/2018 | Honma et al. |
| 10,189,188 | B2 | 1/2019 | Wan et al. |
| 2017/0066208 | A1 | 3/2017 | Khusnatdinov et al. |
| 2017/0158905 | A1 | 6/2017 | Oomatsu et al. |
| 2017/0326583 | A1 | 11/2017 | Ito et al. |
| 2018/0039170 | A1 | 2/2018 | Kato et al. |
| 2019/0011827 | A1 | 1/2019 | Shimizu et al. |
| 2019/0030785 | A1 | 1/2019 | Kato et al. |
| 2022/0317563 | A1 | 10/2022 | Shimizu et al. |

FOREIGN PATENT DOCUMENTS

| | | |
|---|---|---|
| JP | 2016028419 | 2/2016 |
| JP | 2016164961 | 9/2016 |
| JP | 2016164977 | 9/2016 |
| JP | 2017055108 | 3/2017 |
| JP | 2017152705 | 8/2017 |
| JP | 2017206695 | 11/2017 |
| TW | 201736076 | 10/2017 |
| TW | 201807505 | 3/2018 |
| WO | 2016031879 | 3/2016 |
| WO | 2017170428 | 10/2017 |
| WO | 2017175668 | 10/2017 |

OTHER PUBLICATIONS

"Office Action of Taiwan Counterpart Application", issued on Mar. 8, 2023, with Part of English translation thereof, p1-p18.

"International Search Report (Form PCT/ISA/210) of PCT/JP2019/037199," mailed on Dec. 24, 2019, with English translation thereof, pp. 1-5.

"Written Opinion of the International Searching Authority (Form PCT/ISA/237) of PCT/JP2019/037199," mailed on Dec. 24, 2019, with English translation thereof, pp. 1-16.

Toru Umeda et al., "Metal reduction at bulk chemical filtration," Proceedings of SPIE, vol. 10146, Mar. 2017, pp. 1-9.

COMPOSITION FOR FORMING UNDERLAYER FILM FOR IMPRINTING, METHOD FOR PRODUCING COMPOSITION FOR FORMING UNDERLAYER FILM FOR IMPRINTING, PATTERN PRODUCING METHOD, METHOD FOR MANUFACTURING SEMICONDUCTOR ELEMENT, CURED PRODUCT, AND KIT

CROSS-REFERENCE TO RELATED APPLICATIONS

This application is a Continuation of PCT International Application No. PCT/JP2019/037199 filed on Sep. 24, 2019, which claims priority under 35 U.S.C § 119(a) to Japanese Patent Application No. 2018-185117 filed on Sep. 28, 2018. Each of the above application(s) is hereby expressly incorporated by reference, in its entirety, into the present application.

BACKGROUND OF THE INVENTION

1. Field of the Invention

The present invention relates to a composition for forming an underlayer film for imprinting, a method for producing a composition for forming an underlayer film for imprinting, a pattern producing method, a method for manufacturing a semiconductor element, a cured product, and a kit.

2. Description of the Related Art

An imprint method is a technique in which a fine pattern is transferred to a material by pressing a metal mold (generally called a mold or a stamper) on which a pattern is formed. The imprint method enables simple and precise production of a fine pattern, and thus is expected to be applied in various fields in recent years. In particular, a nanoimprint technique for forming a fine pattern of a nano-order level is attracting attention.

As the imprint method, a method called a thermal imprint method or an optical imprint method has been proposed depending on a transfer method thereof. In the thermal imprint method, a mold is pressed against a thermoplastic resin heated to a temperature equal to or higher than a glass transition temperature (hereinafter, referred to as a "Tg" in some cases), the thermoplastic resin is cooled, and then the mold is released to form a fine pattern. In this method, various materials can be selected, but there are also problems in that a high pressure is required during pressing and a fine pattern is not easily formed due to thermal shrinkage or the like.

Meanwhile, in the optical imprint method, after photocuring is performed in a state where a mold is pressed against a curable composition for imprinting, the mold is released. Since the imprinting is performed on an uncured product, a fine pattern can be simply formed without the need for a high pressure or heating at a high temperature.

In the optical imprint method, a curable composition for imprinting is applied onto a substrate (subjected to a close adhesion treatment, as necessary), and a mold made of a light-transmitting material such as quartz is pressed. The curable composition for imprinting is cured by light irradiation in a state where the mold is pressed, and then the mold is released to produce a cured product to which a desired pattern is transferred.

Examples of a method for applying a curable composition for imprinting onto a substrate include a spin coating method and an ink jet method. In particular, the ink jet method is an application method which has attracted attention in recent years from the viewpoint that the loss of the curable composition for imprinting is small.

In addition, a method for performing fine processing using a transferred imprint pattern as a mask is called nanoimprint lithography (NIL), and is being developed as a next-generation lithography technique which replaces the current ArF immersion process.

Meanwhile, in a nanoimprint lithography process, a technique for providing an underlayer film on the substrate to which the curable composition for imprinting is applied has been proposed. JP2013-093552A discloses an adhesive underlayer film for imprinting which contains a compound (A) and a solvent (B) and in which the compound (A) has a specific functional group and an Ohnishi parameter (Z) and a molecular weight are within a predetermined range. Specific examples of other adhesive underlayer films include JP2014-024322A, JP2016-028419A, and JP2017-206695A.

Moreover, JP2017-055108A discloses a method for forming a pretreatment coating on a substrate by using a pretreatment composition containing a polymerizable component, and disposing a discontinuous portion of an imprint resist thereon.

SUMMARY OF THE INVENTION

Here, it was found that the repeated use of the composition for forming an underlayer film for imprinting causes defects in the mold in some cases.

The present invention aims to solve such a problem, and an object thereof is to provide a composition for forming an underlayer film for imprinting having excellent mold durability, a method for producing a composition for forming an underlayer film for imprinting, a pattern producing method, a method for manufacturing a semiconductor element, a cured product, and a kit.

Under the above object, the present inventors performed an investigation, and as a result, found that damage to a mold could be effectively suppressed by reducing an amount of a component, which is a particulate metal including iron, copper, titanium, or lead and has a particle diameter of 10 nm or larger. Meanwhile, it was also found that in a case where imprinting is repeated in the absence of the particulate metal, contamination of the mold is remarkable, and mold durability is degraded. Moreover, it has been found that a favorable performance could be achieved in terms of the mold durability by adopting a configuration in which the component, which is a particulate metal including iron, copper, titanium, or lead and has a particle diameter of 10 nm or larger, is contained in an amount of 50 ppt by mass to 10 ppb by mass with respect to the composition, thereby completing the present invention.

Specifically, the above object has been achieved by the following units.

<1> A composition for forming an underlayer film for imprinting, comprising: a curable component; and a particulate metal which has a particle diameter of 10 nm or larger, as measured by a single particle ICP-MASS method, and includes at least one kind of iron, copper, titanium, or lead, in which a content of the particulate metal is 50 ppt by mass to 10 ppb by mass with respect to the composition.

<2> The composition for forming an underlayer film for imprinting as described in <1>, further comprising a particulate metal which is other than the aforementioned particulate metal, has a particle diameter of 10 nm or larger, as measured by the single particle ICP-MASS method, and includes at least one kind of sodium, potassium, calcium, magnesium, manganese, aluminum, lithium, chromium, nickel, tin, zinc, arsenic, silver, gold, cadmium, cobalt, vanadium, or tungsten, in which a total amount of the particulate metal which has a particle diameter of 10 nm or larger, as measured by the single particle ICP-MASS method, and includes at least one kind of iron, copper, titanium, or lead and the particulate metal which is other than the aforementioned particulate metal, has a particle diameter of 10 nm or larger, as measured by the single particle ICP-MASS method, and includes at least one kind of sodium, potassium, calcium, magnesium, manganese, aluminum, lithium, chromium, nickel, tin, zinc, arsenic, silver, gold, cadmium, cobalt, vanadium, or tungsten is 100 ppt by mass to 30 ppb by mass with respect to the composition.

<3> The composition for forming an underlayer film for imprinting as described in <1> or <2>, in which the curable component includes a resin having an ethylenically unsaturated group and a polar group.

<4> The composition for forming an underlayer film for imprinting as described in <3>, in which the polar group is at least one kind of an alcoholic hydroxyl group, a phenolic hydroxyl group, or a carboxyl group.

<5> The composition for forming an underlayer film for imprinting as described in <3> or <4>, in which the polar group is a nonionic group.

<6> The composition for forming an underlayer film for imprinting as described in any one of <3> to <5>, in which the ethylenically unsaturated group is a (meth) acryloyl group.

<7> The composition for forming an underlayer film for imprinting as described in any one of <1> to <6>, in which the curable component includes a compound which is a liquid at 23° C.

<8> The composition for forming an underlayer film for imprinting as described in <7>, in which the compound which is a liquid at 23° C. has an ethylenically unsaturated group.

<9> The composition for forming an underlayer film for imprinting as described in any one of <1> to <8>, in which the curable component includes a crosslinking agent.

<10> The composition for forming an underlayer film for imprinting as described in any one of <1> to <9>, further comprising a solvent.

<11> The composition for forming an underlayer film for imprinting as described in any one of <1> to <10>, in which a concentration of a solid content is higher than 0% by mass and 1% by mass or lower.

<12> A method for producing a composition for forming an underlayer film for imprinting, comprising: mixing raw materials of the composition for forming an underlayer film for imprinting as described in any one of <1> to <11>; and filtering the mixture with two or more kinds of filters thereafter, in which pore diameters of at least two kinds among the two or more kinds of filters are different from each other.

<13> The method for producing a composition for forming an underlayer film for imprinting as described in <12>, in which materials of at least two kinds among the two or more kinds of filters are different from each other.

<14> The method for producing a composition for forming an underlayer film for imprinting as described in <12> or <13>, in which performing filtration by passing the composition for forming an underlayer film for imprinting through filters in order from a filter having a largest pore diameter among the two or more kinds of filters is included.

<15> The method for producing a composition for forming an underlayer film for imprinting as described in any one of <12> to <14>, in which among the two or more kinds of filters, a pore diameter $X^1$ of a filter having a smallest pore diameter is 0.5 to 15 nm.

<16> The method for producing a composition for forming an underlayer film for imprinting as described in any one of <12> to <15>, in which among the two or more kinds of filters, a pore diameter $X^2$ of a filter having a largest pore diameter is 5 to 100 nm.

<17> The method for producing a composition for forming an underlayer film for imprinting as described in any one of <12> to <16>, in which among the two or more kinds of filters, at least one kind contains a resin having an adsorptive group capable of adsorbing at least one kind of iron, copper, titanium, or lead.

<18> The method for producing a composition for forming an underlayer film for imprinting as described in <17>, in which the resin having an adsorptive group is polyamide.

<19> A pattern producing method comprising: a step of applying the composition for forming an underlayer film for imprinting as described in any one of <1> to <11> to a substrate to form an underlayer film for imprinting; a step of applying a curable composition for imprinting onto the underlayer film for imprinting; a step of exposing the curable composition for imprinting in a state where a mold is in contact with the curable composition for imprinting; and a step of peeling off the mold.

<20> The pattern producing method as described in <19>, in which in the step of forming the underlayer film for imprinting, a spin coating method is used.

<21> The pattern producing method as described in <19> or <20>, in which the step of applying the curable composition for imprinting includes an ink jet method.

<22> A method for manufacturing a semiconductor element, comprising the pattern producing method as described in any one of <19> to <21>.

<23> A cured product formed of the composition for forming an underlayer film for imprinting as described in any one of <1> to <11>.

<24> A kit comprising: the composition for forming an underlayer film for imprinting as described in any one of <1> to <11>; and a curable composition for imprinting that contains a polymerizable compound, and particulate metals which have a particle diameter of 10 nm or larger, as measured by a single particle ICP-MASS method, and include at least one kind of iron, copper, titanium, or lead, in which a total content of the particulate metals is 100 ppt by mass to 30 ppb by mass with respect to a solid content of the curable composition for imprinting.

According to the present invention, it is possible to provide a composition for forming an underlayer film for imprinting having excellent mold durability, a method for producing a composition for forming an underlayer film for imprinting, a pattern producing method, a method for manufacturing a semiconductor element, a cured product, and a kit.

DESCRIPTION OF THE PREFERRED EMBODIMENTS

Figures 1A, 1B, 1C, 1D, 1E, 1F, 1G:
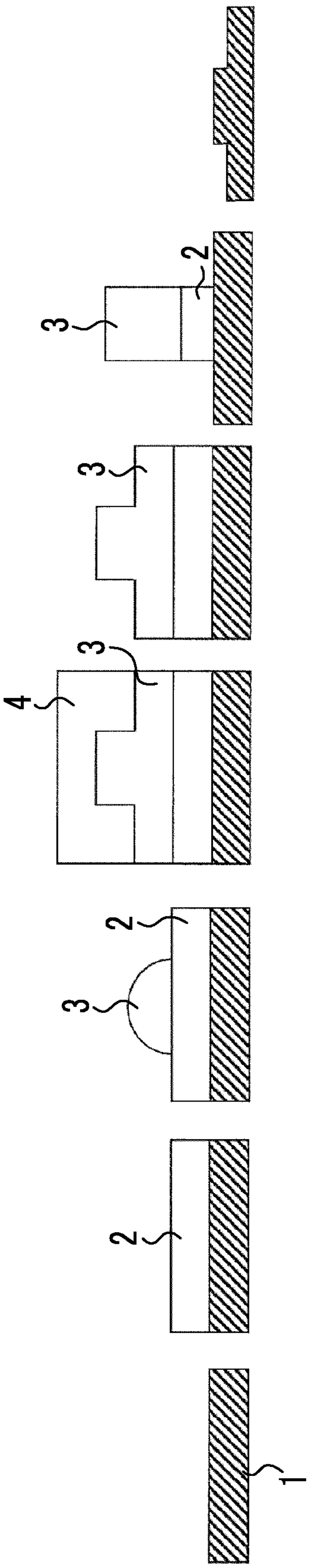
FIGS. 1A to 1G are step explanatory diagrams showing an example of pattern formation and a production process in a case where the obtained pattern is used in processing of a substrate by etching.

Hereinafter, contents of the present invention will be described in detail. Moreover, in the present specification, "to" is used to mean that the preceding and succeeding numerical values of "to" are included as a lower limit value and an upper limit value, respectively.

In the present specification, "(meth)acrylate" represents acrylate and methacrylate, "(meth)acryl" represents acryl and methacryl, and "(meth)acryloyl" represents acryloyl and methacryloyl. "(Meth)acryloyloxy" represents acryloyloxy and methacryloyloxy.

In the present specification, "imprint" preferably refers to transfer of a pattern with a size of 1 nm to 10 mm, and more preferably refers to transfer of a pattern with a size of about 10 nm to 100 m (nanoimprint).

In descriptions of a group (atomic group) in the present specification, in a case where the group is described without specifying whether the group is substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

In the present specification, "light" includes not only light having a wavelength in an ultraviolet, near-ultraviolet, far-ultraviolet, visible, or infrared range, or an electromagnetic wave but also radiation. Examples of the radiation include a microwave, an electron beam, an extreme ultraviolet ray (EUV), and an X-ray. Moreover, laser light such as a 248-nm excimer laser, a 193-nm excimer laser, and a 172-nm excimer laser can also be used. The light may be monochromatic light (single-wavelength light) passing through an optical filter, or may be light (composite light) having a plurality of different wavelengths.

In the present specification, a solid content refers to a total mass of all components of the composition, excluding a solvent.

In the present invention, an atmospheric pressure in a case of measuring a boiling point is 101,325 Pa (1 atm), unless otherwise specified. In the present invention, a temperature is 23° C., unless otherwise specified.

In the present specification, a term "step" includes not only an independent step, but also a step which is not clearly distinguished from other steps in a case where an intended action of the step is obtained.

In the present specification, a weight-average molecular weight (Mw) and a number-average molecular weight (Mn) are each defined as a value in terms of polystyrene according to gel permeation chromatography (GPC measurement), unless otherwise specified. In the present specification, the weight-average molecular weight (Mw) and the number-average molecular weight (Mn) can be determined, for example, by using HLC-8220 (manufactured by TOSOH CORPORATION), and, as a column, GUARD COLUMN HZ-L, TSKgel Super HZM-M, TSKgel Super HZ4000, TSKgel Super HZ3000, or TSKgel Super HZ2000 (manufactured by TOSOH CORPORATION). An eluent is measured using tetrahydrofuran (THF), unless otherwise specified. Moreover, for detection, a detector of ultraviolet rays (UV rays) having a wavelength of 254 nm is used, unless otherwise specified.

A composition for forming an underlayer film for imprinting according to an embodiment of the present invention is a composition for forming an underlayer film for imprinting containing: a curable component; and a particulate metal which has a particle diameter of 10 nm or larger, as measured by a single particle inductively coupled plasma (ICP)-mass spectrometry (MASS) method, and includes at least one kind of iron, copper, titanium, or lead, in which a content of the particulate metal is 50 ppt by mass to 10 ppb by mass with respect to the composition.

It is presumed that by setting an amount of a specific particulate metal to 10 ppb by mass or less as described above, damage to a mold can be effectively suppressed, and thus mold durability can be improved. This mechanism is presumed to be possible because contact between the specific particulate metal and a surface of the mold can be reduced. Moreover, it is presumed that by setting the amount of the specific particulate metal to 50 ppt by mass or greater, contamination of a mold can be effectively suppressed, and thus mold durability can be improved. This mechanism is presumed to be possible because contamination of the mold can be suppressed by attaching an adsorptive substance contained in a composition for forming an underlayer film for imprinting to particles.

Further, by using a particulate metal having a particle diameter of 10 nm or larger, as measured by the single particle ICP-MASS method, a particulate metal having a size which is equal to or greater than that of a residual film (usually, 10 to 50 nm) during nanoimprinting can be removed, and mold durability is improved.

Furthermore, it is presumed that in a case where the composition for forming an underlayer film for imprinting is applied onto a substrate, there is also a correlation between the number of defects generated in an imprint pattern provided on an underlayer film and a concentration of the specific particulate metal contained in the composition for forming an underlayer film for imprinting. Specifically, it was found that generation of defects can be significantly suppressed by suppressing the concentration of the specific particulate metal contained in the composition for forming an underlayer film for imprinting within a specified value. Moreover, it was found that the amount of the specific particulate metal in the composition for forming an underlayer film for imprinting can be significantly reduced by subjecting the composition for forming an underlayer film for imprinting to a specific filter filtration treatment.

Hereinafter, the present invention will be described in detail.

<Specific Particulate Metal>

The composition for forming an underlayer film for imprinting contains, in a proportion of 50 ppt by mass to 10 ppb by mass in total with respect to the composition, a particulate metal (specific particulate metal) which has a particle diameter of 10 nm or larger, as measured by the single particle ICP-MASS method, and includes at least one kind of iron, copper, titanium, or lead.

The specific particulate metal is not particularly specified as long as the specific particulate metal is a particle including at least one kind of iron, copper, titanium, or lead, and is intended to also include a particle consisting of two or more kinds of iron, copper, titanium, and lead, a particle consisting of at least one kind of iron, copper, titanium, or lead and another metal, and a particle consisting of at least one kind of iron, copper, titanium, or lead and a nonmetal.

A particle diameter of the specific particulate metal is 10 nm or larger. The upper limit thereof is not particularly specified as long as the amount of the specific particulate metal is 10 ppb by mass or less with respect to the composition, but is practically 100 nm or smaller.

In a case where the specific particulate metal is present in the composition for forming an underlayer film for imprinting in an amount of greater than 10 ppb by mass, the specific particulate metal is deposited on the formed underlayer film, and inhibits contact with the mold and filling with the curable composition for imprinting. As a result, non-filling of the mold with the curable composition for imprinting, or the like is caused, which leads to induction of pattern defects. Moreover, in a case where the mold is brought into physical contact with the specific particulate metal, damage to a pattern shape of the mold is caused. Further, in a case where the specific particulate metal is deposited, the specific particulate metal functions as an etching stopper during dry etching, and thus etching defects are generated. Furthermore, it was found that in a case where the particle diameter of the specific particulate metal is 10 nm or larger, damage to the mold pattern is caused by the contact between the specific particulate metal and the mold. In the present invention, such a problem is solved by adopting the aforementioned configuration.

The composition for forming an underlayer film for imprinting contains the specific particulate metal in a proportion of 50 ppt by mass to 10 ppb by mass with respect to the composition. By setting the content to be equal to or less than the upper limit value, mold durability is improved, generation of etching defects is remarkably suppressed, and a yield of a semiconductor element is improved. Moreover, temporal stability of the composition for forming an underlayer film for imprinting can also be improved.

The lower limit value of the content of the specific particulate metal is preferably 90 ppt by mass or greater and more preferably 100 ppt by mass or greater. Moreover, the upper limit value of the content of the specific particulate metal is preferably 8 ppb by mass or less, more preferably 5 ppb by mass or less, still more preferably 4 ppb by mass or less, even more preferably 3 ppb by mass or less, and further still more preferably 2 ppb by mass or less. As described above, by setting the amount of the specific particulate metal to 10 ppb by mass or less, damage to the mold (in particular, damage to the mold pattern) can be suppressed. Meanwhile, by setting the amount to 50 ppt by mass or greater, contamination of the mold in a case where imprinting is repeatedly performed can be effectively suppressed.

The lower limit value of a content of a particulate metal which has a particle diameter of 10 nm or larger, as measured by the single particle ICP-MASS method, and includes iron is preferably 0.02 ppb by mass or greater and more preferably 0.08 ppb by mass or greater. Moreover, the upper limit value thereof is preferably 10 ppb by mass or less, more preferably 7 ppb by mass or less, still more preferably 2 ppb by mass or less, and even more preferably 1 ppb by mass or less.

The lower limit value of a content of a particulate metal which has a particle diameter of 10 nm or larger, as measured by the single particle ICP-MASS method, and includes copper is preferably 0.01 ppb by mass or greater and more preferably 0.05 ppb by mass or greater. Moreover, the upper limit value thereof is preferably 5 ppb by mass or less, more preferably 3 ppb by mass or less, still more preferably 1 ppb by mass or less, and even more preferably 0.7 ppb by mass or less.

The lower limit value of a content of a particulate metal which has a particle diameter of 10 nm or larger, as measured by the single particle ICP-MASS method, and includes titanium is preferably 0.01 ppb by mass or greater and more preferably 0.02 ppb by mass or greater. Moreover, the upper limit value thereof is preferably 5 ppb by mass or less, more preferably 2 ppb by mass or less, still more preferably 1 ppb by mass or less, and even more preferably 0.5 ppb by mass or less.

The lower limit value of a content of a particulate metal which has a particle diameter of 10 nm or larger, as measured by the single particle ICP-MASS method, and includes lead is preferably 0.005 ppb by mass or greater. Moreover, the upper limit value thereof is preferably 1 ppb by mass or less and more preferably 0.6 ppb by mass or less.

The particle diameter (particle diameter measured by the single particle ICP-MASS method) and the content of the specific particulate metal are measured by methods described in Examples described later. In a case where the measurement is not possible with equipment used in Examples, or in a case where the equipment is difficult to obtain due to discontinuance or the like, Agilent 8900 can be used, and in a case where the measurement is not possible with Agilent 8900, or in a case where the equipment is difficult to obtain due to discontinuance or the like, NexION350S manufactured by PerkinElmer Co., Ltd. can be used.

<Particulate Metal Including Metal Other than Specific Particulate Metal>

The composition for forming an underlayer film for imprinting contains a particulate metal (hereinafter, referred to as a "particulate metal including other metals" in some cases) which is other than the aforementioned specific particulate metal, has a particle diameter of 10 nm or larger, as measured by the single particle ICP-MASS method, and includes at least one kind of sodium, potassium, calcium, magnesium, manganese, aluminum, lithium, chromium, nickel, tin, zinc, arsenic, silver, gold, cadmium, cobalt, vanadium, or tungsten, and a total amount thereof is preferably 100 ppt by mass to 30 ppb by mass with respect to the composition. With such a configuration, the effects of the present invention are more effectively exhibited. Moreover, releasability can also be improved.

The lower limit value of a total content of the specific particulate metal and the particulate metal including other metals is preferably 0.1 ppb by mass or greater and more preferably 0.3 ppb by mass or greater. Moreover, the upper limit value thereof is preferably 75 ppb by mass or less, more preferably 70 ppb by mass or less, still more preferably 40 ppb by mass or less, even more preferably 30 ppb by mass or less, further still more preferably 25 ppb by mass or less, further still more preferably 10 ppb by mass or less, further still more preferably 6 ppb by mass or less, further still more preferably 4 ppb by mass or less, and most preferably 3 ppb by mass or less.

The particle diameter and the content of the particulate metal including a metal other than the specific particulate metal are measured by the methods described in Examples described later.

The composition for forming an underlayer film for imprinting preferably contains at least two kinds of sodium, potassium, calcium, magnesium, manganese, aluminum, lithium, chromium, nickel, tin, zinc, arsenic, silver, gold, cadmium, cobalt, vanadium, or tungsten, more preferably contains at least three kinds among them, and still more preferably contains at least four kinds among them, as the particulate metal including a metal other than the specific particulate metal. With such a configuration, the mold durability tends to be further improved.

<Curable Component>

The composition for forming an underlayer film for imprinting according to the embodiment of the present invention contains a curable component. The curable component is a component constituting the underlayer film, and may be any one of a high-molecular-weight component (for example, a molecular weight is greater than 1,000) or a low-molecular-weight component (for example, a molecular weight is less than 1,000). Specific examples thereof include a resin, a compound which is a liquid at 23° C., and a crosslinking agent. Only one kind or two or more kinds of the respective components may be used.

A first embodiment of the curable component in the present invention is an aspect in which 90% by mass or greater of the curable component is a resin. In the first embodiment, the resin is preferably a resin having an ethylenically unsaturated group and a polar group.

A second embodiment of the curable component in the present invention is an aspect in which the curable component includes a resin and a compound which is a liquid at 23° C. In the second embodiment, it is preferable that 40% to 90% by mass (preferably 70% to 90% by mass) of the curable component is the resin, and 10% to 60% by mass (preferably 10% to 30% by mass) of the curable component is the compound which is a liquid at 23° C. The compound which is a liquid at 23° C. is preferably a compound having an ethylenically unsaturated group.

A third embodiment of the curable component in the present invention is an aspect in which the curable component includes a resin and a crosslinking agent. In the third embodiment, it is preferable that 50% to 90% by mass (preferably 65% to 80% by mass) of the curable component is the resin, and 10% to 50% by mass (preferably 20% to 35% by mass) of the curable component is the crosslinking agent. In a case where the curable component adopts the third embodiment, the composition for forming an underlayer film for imprinting preferably contains a thermal acid generator.

A fourth embodiment of the curable component in the present invention is an aspect in which 90% by mass or greater of the curable component is a compound which is a liquid at 23° C. The compound which is a liquid at 23° C. is preferably a compound having an ethylenically unsaturated group.

A total content of the curable components in the composition for forming an underlayer film for imprinting is not particularly limited, but is preferably 50% by mass or greater in the solid content, more preferably 70% by mass or greater in the solid content, and still more preferably 80% by mass or greater in the solid content. The upper limit thereof is not particularly limited, but is preferably 99.9% by mass or less.

A concentration of the curable component in the composition for forming an underlayer film for imprinting (including a solvent) is not particularly limited, but is preferably 0.01% by mass or higher, more preferably 0.05% by mass or higher, and still more preferably 0.1% by mass or higher. The upper limit thereof is preferably 10% by mass or lower, more preferably 5% by mass or lower, still more preferably 1% by mass or lower, and even more preferably less than 1% by mass.

<<Resin>>

As the resin used in the present invention, known resins can be widely used.

The resin used in the present invention preferably has at least one of an ethylenically unsaturated group or a polar group, and more preferably has both an ethylenically unsaturated group and a polar group.

By having an ethylenically unsaturated group, an underlayer film having excellent hardness can be obtained. Moreover, by having a polar group, adhesiveness to a substrate is improved. Furthermore, in a case where a crosslinking agent is formulated, a crosslinked structure formed after curing is further firmed, and hardness of the obtained underlayer film can be improved.

Examples of the ethylenically unsaturated group include a (meth)acryloyl group (preferably a (meth)acryloyloxy group and a (meth)acryloylamino group), a vinyl group, a vinyloxy group, an allyl group, a methylallyl group, a propenyl group, a butenyl group, a vinylphenyl group, and a cyclohexenyl group, a (meth)acryloyl group and a vinyl group are preferable, a (meth)acryloyl group is more preferable, and a (meth)acryloyloxy group is still more preferable. The ethylenically unsaturated group defined here is referred to as Et.

Furthermore, the polar group is preferably at least one kind of an acyloxy group, a carbamoyloxy group, a sulfonyloxy group, an acyl group, an alkoxycarbonyl group, an acylamino group, a carbamoyl group, an alkoxycarbonylamino group, a sulfonamide group, a phosphoric acid group, a carboxyl group, or a hydroxyl group, more preferably at least one kind of an alcoholic hydroxyl group, a phenolic hydroxyl group, or a carboxyl group, and still more preferably an alcoholic hydroxyl group or a carboxyl group. The polar group defined here is referred to as a polar group Po.

The polar group is preferably a nonionic group.

The resin used in the present invention may further contain a cyclic ether group. Examples of the cyclic ether group include an epoxy group and an oxetanyl group, and an epoxy group is preferable. The cyclic ether group defined here is referred to as a cyclic ether group Cyt.

Examples of the resin include a (meth)acrylic resin, a vinyl resin, a novolac resin, a phenol resin, a melamine resin, a urea resin, an epoxy resin, and a polyimide resin, and at least one kind of a (meth)acrylic resin, a vinyl resin, or a novolac resin is preferable.

A weight-average molecular weight of the resin is preferably 4,000 or greater, more preferably 6,000 or greater, and still more preferably 8,000 or greater. The upper limit thereof is preferably 1,000,000 or less and may be 500,000 or less.

The resin preferably has at least one of constitutional units represented by Formulae (1) to (3).

(1)

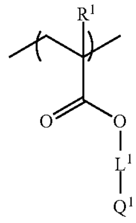

-continued (2)

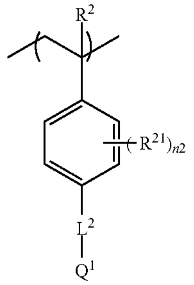

(3)

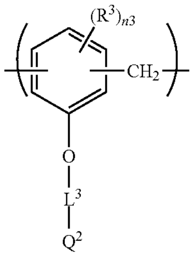

In the formulae, $R^1$ and $R^2$ are each independently a hydrogen atom or a methyl group. $R^{21}$ and $R^3$ are each independently a substituent. $L^1$, $L^2$, and $L^3$ are each independently a single bond or a linking group. n2 is an integer of 0 to 4. n3 is an integer of 0 to 3. $Q^1$ is an ethylenically unsaturated group or a cyclic ether group. $Q^2$ is an ethylenically unsaturated group, a cyclic ether group, or a polar group.

$R^1$ and $R^2$ are each preferably a methyl group.

It is preferable that $R^{21}$ and $R^3$ are each independently a substituent T described later.

In a case where there are a plurality of $R^{21}$'s, $R^{21}$'s may be linked to each other to form a cyclic structure. In the present specification, the linking means not only an aspect in which groups are continued by bonding but also an aspect in which groups lose some atoms and are fused (condensed). Moreover, unless otherwise specified, an oxygen atom, a sulfur atom, and a nitrogen atom (amino group) may be included in the linking cyclic structure. Examples of the formed cyclic structure include an aliphatic hydrocarbon ring (groups exemplified below are referred to as a ring Cf) (for example, a cyclopropyl group, a cyclobutyl group, a cyclopentyl group, a cyclohexyl group, a cyclopropenyl group, a cyclobutenyl group, a cyclopentenyl group, a cyclohexenyl group, and the like), an aromatic hydrocarbon ring (rings exemplified below are referred to as a ring Cr) (a benzene ring, a naphthalene ring, an anthracene ring, a phenanthrene ring, and the like), a nitrogen-containing heterocycle (rings exemplified below are referred to as a ring Cn) (for example, a pyrrole ring, an imidazole ring, a pyrazole ring, a pyridine ring, a pyrroline ring, a pyrrolidine ring, an imidazolidine ring, a pyrazolidine ring, a piperidine ring, a piperazine ring, a morpholine ring, and the like), an oxygen-containing heterocycle (rings exemplified below are referred to as a ring Co) (a furan ring, a pyran ring, an oxirane ring, an oxetane ring, a tetrahydrofuran ring, a tetrahydropyran ring, a dioxane ring, and the like), and a sulfur-containing heterocycle (rings exemplified below are referred to as a ring Cs) (a thiophene ring, a thiirane ring, a thietane ring, a tetrahydrothiophene ring, a tetrahydrothiopyran ring, and the like).

In a case where there are a plurality of $R^3$'s, $R^3$'s may be linked to each other to form a cyclic structure. Examples of the formed cyclic structure include ring Cf, the ring Cr, the ring Cn, the ring Co, and the ring Cs.

It is preferable that $L^1$, $L^2$, and $L^3$ are each independently a single bond or a linking group L described later. Among them, a single bond, or an alkylene group or an (oligo) alkyleneoxy group, which is defined as the linking group L, is preferable, and an alkylene group is more preferable. The linking group L preferably has the polar group Po as a substituent. Moreover, an aspect in which the alkylene group has a hydroxyl group as a substituent is also preferable.

n2 is preferably 0 or 1 and more preferably 0. n3 is preferably 0 or 1 and more preferably 0.

$Q^1$ is preferably the ethylenically unsaturated group Et.

$Q^2$ is preferably a polar group or preferably an alkyl group having an alcoholic hydroxyl group.

The resin may further contain at least one of a constitutional unit (11), a constitutional unit (21), or a constitutional unit (31). In particular, in the resin included in the present invention, the constitutional unit (11) is preferably combined with the constitutional unit (1), the constitutional unit (21) is preferably combined with the constitutional unit (2), and the constitutional unit (31) is preferably combined with the constitutional unit (3).

(11)

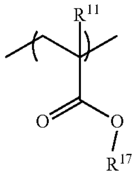

(21)

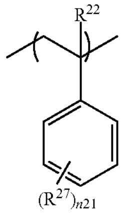

(31)

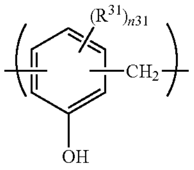

In the formulae, $R^{11}$ and $R^{22}$ are each independently a hydrogen atom or a methyl group. $R^7$ is a substituent. $R^{27}$ is a substituent. n21 is an integer of 0 to 5. $R^{31}$ is a substituent, and n31 is an integer of 0 to 3.

$R^{11}$ and $R^{22}$ are each preferably a methyl group.

$R^{17}$ is preferably a group containing a polar group or a group containing a cyclic ether group. In a case where $R^{17}$ is a group containing a polar group, $R^{17}$ is preferably a group containing the polar group Po and more preferably the polar group Po or the substituent T substituted with the polar group Po. In a case where $R^{17}$ is a group containing a cyclic ether group, $R^{17}$ is preferably a group containing the cyclic ether group Cyt and more preferably the substituent T substituted with the cyclic ether group Cyt.

$R^{27}$ is a substituent, and at least one of $R^{27}$'s is preferably a polar group. The substituent is preferably the substituent T described later. n21 is preferably 0 or 1 and more preferably 0. In a case where there are a plurality of $R^{27}$'s, $R^{27}$'s may be linked to each other to form a cyclic structure. Examples of the formed cyclic structure include examples of the ring Cf, the ring Cr, the ring Cn, the ring Co, and the ring Cs.

$R^{31}$ is preferably the substituent T described later. n31 is an integer of 0 to 3, preferably 0 or 1, and more preferably 0. In a case where there are a plurality of $R^{31}$'s, $R^{31}$'s may be linked to each other to form a cyclic structure. Examples of the formed cyclic structure include examples of the ring Cf, the ring Cr, the ring Cn, the ring Co, and the ring Cs.

Examples of the substituent T include an alkyl group (the number of the carbon atoms is preferably 1 to 24, more preferably 1 to 12, and still more preferably 1 to 6), an arylalkyl group (the number of the carbon atoms is preferably 7 to 21, more preferably 7 to 15, and still more preferably 7 to 11), an alkenyl group (the number of the carbon atoms is preferably 2 to 24, more preferably 2 to 12, and still more preferably 2 to 6), a hydroxyl group, an amino group ($—NR^N_2$) (the number of the carbon atoms is preferably 0 to 24, more preferably 0 to 12, and still more preferably 0 to 6), a sulfanyl group, a carboxyl group, an aryl group (the number of the carbon atoms is preferably 6 to 22, more preferably 6 to 18, and still more preferably 6 to 10), an alkoxy group (the number of the carbon atoms is preferably 1 to 12, more preferably 1 to 6, and still more preferably 1 to 3), an aryloxy group (the number of the carbon atoms is preferably 6 to 22, more preferably 6 to 18, and still more preferably 6 to 10), an acyl group (the number of the carbon atoms is preferably 2 to 12, more preferably 2 to 6, and still more preferably 2 or 3), an acyloxy group (the number of the carbon atoms is preferably 2 to 12, more preferably 2 to 6, and still more preferably 2 or 3), an aryloyl group (the number of the carbon atoms is preferably 7 to 23, more preferably 7 to 19, and still more preferably 7 to 11), an aryloyloxy group (the number of the carbon atoms is preferably 7 to 23, more preferably 7 to 19, and still more preferably 7 to 11), a carbamoyl group (the number of the carbon atoms is preferably 1 to 12, more preferably 1 to 6, and still more preferably 1 to 3), a sulfamoyl group (the number of the carbon atoms is preferably 0 to 12, more preferably 0 to 6, and still more preferably 0 to 3), a sulfo group, a sulfooxy group, a phosphono group, a phosphonooxy group, an alkylsulfonyl group (the number of the carbon atoms is preferably 1 to 12, more preferably 1 to 6, and still more preferably 1 to 3), an arylsulfonyl group (the number of the carbon atoms is preferably 6 to 22, more preferably 6 to 18, and still more preferably 6 to 10), a heterocyclic group (containing at least one of an oxygen atom, a nitrogen atom, or a sulfur atom; and the number of the carbon atoms is preferably 1 to 12, more preferably 1 to 8, and still more preferably 2 to 5, and a 5-membered ring or a 6-membered ring is preferably contained), a (meth)acryloyl group, a (meth)acryloyloxy group, a halogen atom (for example, a fluorine atom, a chlorine atom, a bromine atom, and an iodine atom), an oxo group (=O), an imino group ($=NR^N$), and an alkylidene group ($=C(R^N)_2$).

$R^N$ is a hydrogen atom, an alkyl group of the substituent T, an alkenyl group of the substituent T, an aryl group of the substituent T, an arylalkyl group of the substituent T, or a heterocyclic group of the substituent T.

An alkyl moiety and an alkenyl moiety contained in each substituent may be chain-like or cyclic, or may be linear or branched. In a case where the substituent T is a group capable of taking a substituent, the substituent T may further have a substituent T. For example, a hydroxyalkyl group in which a hydroxyl group is substituted for an alkyl group may be mentioned.

Examples of the linking group L include an alkylene group (the number of the carbon atoms is preferably 1 to 24, more preferably 1 to 12, and still more preferably 1 to 6), an alkenylene group (the number of the carbon atoms is preferably 2 to 12, more preferably 2 to 6, and still more preferably 2 or 3), an (oligo)alkyleneoxy group (the number of carbon atoms in an alkylene group in one constitutional unit is preferably 1 to 12, more preferably 1 to 6, and still more preferably 1 to 3; and the number of repetitions is preferably 1 to 50, more preferably 1 to 40, and still more preferably 1 to 30), an arylene group (the number of the carbon atoms is preferably 6 to 22, more preferably 6 to 18, and still more preferably 6 to 10), an oxygen atom, a sulfur atom, a sulfonyl group, a carbonyl group, a thiocarbonyl group, $—NR^N—$, and a linking group related to a combination thereof. The alkylene group, alkenylene group, and alkyleneoxy group may have the substituent T. For example, the alkylene group may have a hydroxyl group.

A linking chain length of the linking group L is preferably 1 to 24, more preferably 1 to 12, and still more preferably 1 to 6. The linking chain length means the number of atoms positioned on the shortest path among the atomic groups involved in the linkage. For example, in a case of $—CH_2—(C=O)—O—$, the linking chain length is 3.

Furthermore, the alkylene group, alkenylene group, and (oligo)alkyleneoxy group, which are defined as the linking group L, may be chain-like or cyclic, or may be linear or branched.

It is preferable that as an atom constituting the linking group L, a carbon atom, a hydrogen atom, and if necessary, a heteroatom (at least one kind selected from an oxygen atom, a nitrogen atom, or a sulfur atom, and the like) are included. The number of carbon atoms in the linking group is preferably 1 to 24, more preferably 1 to 12, and still more preferably 1 to 6. The number of hydrogen atom may be determined according to the number of carbon atoms and the like. In a case of the number of heteroatoms, the numbers of the oxygen atoms, the nitrogen atoms, and the sulfur atoms are each independently preferably 0 to 12, more preferably 0 to 6, and still more preferably 0 to 3.

The resin may be synthesized by a conventional method. For example, for a resin having the constitutional unit represented by Formula (1), a known method for addition polymerization of olefin can be appropriately adopted. For a resin having the constitutional unit represented by Formula (2), a known method for addition polymerization of styrene can be appropriately adopted. For a resin having the constitutional unit represented by Formula (3), a known method for synthesis of a phenol resin can be appropriately adopted.

One kind of the resin may be used, or a plurality thereof may be used.

As the resin as the curable component, in addition to the aforementioned resins, the resins described in paragraphs 0016 to 0079 of WO2016/152600A, paragraphs 0025 to 0078 of WO2016/148095A, paragraphs 0015 to 0077 of WO2016/031879A, and paragraphs 0015 to 0057 of WO2016/027843A can be used, the contents of which are incorporated in the present specification.

<<Compound which is Liquid at 23° C.>>

The curable component may be a compound which is a liquid at 23° C.

The compound which is a liquid at 23° C. preferably has an ethylenically unsaturated group and more preferably has the ethylenically unsaturated group Et.

A viscosity of the compound, which is a liquid at 23° C., at 23° C. is preferably 20.0 mPa·s or lower, more preferably 15.0 mPa·s or lower, still more preferably 11.0 mPa·s or lower, and even more preferably 9.0 mPa·s or lower. The lower limit value of the viscosity is not particularly limited, but can be, for example, 1.0 mPa·s or higher. By using a compound having such a low viscosity, crosslinking can be efficiently promoted.

The compound which is a liquid at 23° C. may have only one ethylenically unsaturated group or two or more ethylenically unsaturated groups in one molecule, and preferably has two to six ethylenically unsaturated groups and more preferably has two to four ethylenically unsaturated groups.

The compound which is a liquid at 23° C. is preferably represented by Formula (2).

(2)

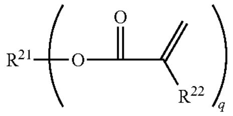

In the formula, $R^{21}$ is a q-valent organic group, $R^{22}$ is a hydrogen atom or a methyl group, and q is an integer of 2 or more. q is preferably an integer of 2 to 7, more preferably an integer of 2 to 4, and still more preferably 2 or 3.

$R^{21}$ is preferably a divalent to heptavalent organic group, more preferably a divalent to tetravalent organic group, and still more preferably a divalent or trivalent organic group. $R^{21}$ is preferably a hydrocarbon group having at least one of a linear structure, a branched structure, or a cyclic structure. The number of carbon atoms in the hydrocarbon group is preferably 2 to 20 and more preferably 2 to 10.

In a case where $R^{21}$ is a divalent organic group, $R^{21}$ is preferably an organic group represented by Formula (1-2).

(1-2)

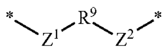

In the formula, it is preferable that $Z^1$ and $Z^2$ are each independently a single bond, -Alk-, -AlkO-, or —OAlkO—. Alk represents an alkylene group (the number of the carbon atoms is preferably 1 to 12, more preferably 1 to 6, and still more preferably 1 to 3), and may have a substituent as long as the effects of the present invention are not impaired.

$R^9$ is preferably a single bond, a linking group selected from Formulae (9-1) to (9-10), or a combination thereof. Among them, a linking group selected from Formulae (9-1) to (9-3), (9-7), and (9-8) is preferable.

9-1

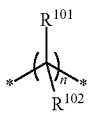

9-2

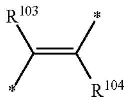

-continued 9-3

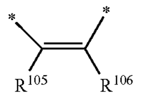

9-4

9-5

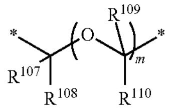

9-6

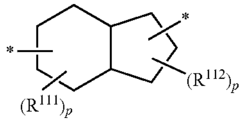

9-7

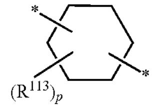

9-8

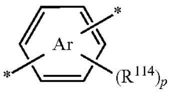

9-9

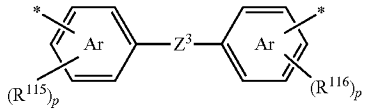

9-10

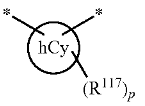

$R^{101}$ to $R^{117}$ are optional substituents. Among them, an alkyl group (the number of the carbon atoms is preferably 1 to 12, more preferably 1 to 6, and still more preferably 1 to 3), an aralkyl group (the number of the carbon atoms is preferably 7 to 21, more preferably 7 to 15, and still more preferably 7 to 11), an aryl group (the number of the carbon atoms is preferably 6 to 22, more preferably 6 to 18, and still more preferably 6 to 10), a thienyl group, a furyl group, a (meth)acryloyl group, a (meth)acryloyloxy group, and a (meth)acryloyloxyalkyl group (the number of the carbon atoms in the alkyl group is preferably 1 to 24, more preferably 1 to 12, and still more preferably 1 to 6) are preferable. $R^{101}$ and $R^{102}$, $R^{103}$ and $R^{104}$, $R^{105}$ and $R^{106}$, $R^{107}$ and $R^{108}$, $R^{109}$ and $R^{110}$, a plurality of $R^{111}$'s, a plurality of $R^{112}$'s, a plurality of $R^{113}$'s, a plurality of $R^{114}$'s, a plurality of $R^{115}$'s, a plurality of $R^{116}$'s, and a plurality of $R^{117}$'s may be respectively bonded to each other to form a ring.

Ar is an arylene group (the number of the carbon atoms is preferably 6 to 22, more preferably 6 to 18, and still more preferably 6 to 10), and specific examples thereof include a phenylene group, a naphthalenediyl group, an anthracenediyl group, a phenanthrenediyl group, and a fluorenediyl group.

hCy is a heterocyclic group (the number of the carbon atoms is preferably 1 to 12, more preferably 1 to 6, and still more preferably 2 to 5), and is more preferably a 5-membered ring or a 6-membered ring. Specific examples of a heterocyclic ring constituting hCy include a thiophene ring, a furan ring, a dibenzofuran ring, a carbazole ring, an indole ring, a tetrahydropyran ring, a tetrahydrofuran ring, a pyrrole ring, a pyridine ring, a pyrazole ring, an imidazole ring, a benzimidazole ring, a triazole ring, a thiazole ring, an oxazole ring, a pyrrolidone ring, and a morpholine ring, and among them, a thiophene ring, a furan ring, and a dibenzofuran ring are preferable.

$Z^3$ is a single bond or a linking group. Examples of the linking group include alkylene groups (the number of the carbon atoms is preferably 1 to 12, more preferably 1 to 6, and still more preferably 1 to 3) in which an oxygen atom, a sulfur atom, and a fluorine atom may be substituted.

n and m are each a natural number of 100 or less, preferably 1 to 12, more preferably 1 to 6, and still more preferably 1 to 3.

p is 0 or more and is an integer equal to or less than the maximum number of groups which can be substituted for each ring. In the respective cases, the upper limit values are independently preferably equal to or less than half of the maximum number of the substitutable group, more preferably 4 or less, and still more preferably 2 or less.

A type of an atom constituting the compound, which is a liquid at 23° C., used in the present invention is not particularly specified, but the compound is preferably constituted of only atoms selected from a carbon atom, an oxygen atom, a hydrogen atom, and a halogen atom, and more preferably constituted of only atoms selected from a carbon atom, an oxygen atom, and a hydrogen atom.

Examples of the compound, which is a liquid at 23° C., preferably used in the present invention include the polymerizable compound described in JP2014-170949A, the contents of which are incorporated in the present specification.

<<Crosslinking Agent>>

The crosslinking agent used in the present invention is not particularly limited as long as the crosslinking agent advances curing by a crosslinking reaction. In the present invention, the crosslinking agent is preferably reacted with a polar group of a resin to form a crosslinked structure. By using such a crosslinking agent, the resin is more firmly bonded, and a firmer film can be obtained.

Examples of the crosslinking agent include an epoxy compound (compound having an epoxy group), an oxetanyl compound (compound having an oxetanyl group), an alkoxymethyl compound (compound having an alkoxymethyl group), a methylol compound (compound having a methylol group), and a blocked isocyanate compound (compound having a blocked isocyanate group), and an alkoxymethyl compound (compound having an alkoxymethyl group) can form a firm bond at a low temperature and thus is preferable.

(Epoxy Compound)

The epoxy compound is preferably a compound having two or more epoxy groups in one molecule. The number of epoxy groups is preferably 2 to 100 in one molecule. The upper limit thereof can also be, for example, 10 or less or 5 or less. For the details of the epoxy compound, reference can be made to the description in paragraphs 0132 to 0142 of JP2017-171784A, the contents of which are incorporated in the present specification.

(Oxetanyl Compound)

The oxetanyl compound is preferably a compound having two or more oxetanyl groups in one molecule. The number of oxetanyl groups is preferably 2 to 100 in one molecule. The upper limit thereof can also be, for example, 10 or less or 5 or less. Specific examples of the compound having two or more oxetanyl groups in one molecule include ARON OXETANE OXT-121, OXT-221, OX-SQ, and PNOX (all produced by TOAGOSEI CO., LTD.), and ETERNACOLL (registered trademark) OXMA and ETERNACOLL (registered trademark) OXBP (produced by UBE INDUSTRIES, LTD.).

(Alkoxymethyl Compound and Methylol Compound)

Examples of the alkoxymethyl compound and the methylol compound include compounds in which an alkoxymethyl group or a methylol group is bonded to a nitrogen atom or a carbon atom forming an aromatic ring.

As the compound in which an alkoxymethyl group or a methylol group is bonded to a nitrogen atom, alkoxymethylated melamine, methylolated melamine, alkoxymethylated benzoguanamine, methylolated benzoguanamine, alkoxymethylated glycoluril, methylolated glycoluril, alkoxymethylated urea, methylolated urea, and the like are preferable. Moreover, reference can be made to the description in paragraphs 0134 to 0147 of JP2004-295116A and paragraphs 0095 to 0126 of JP2014-089408A, the contents of which are incorporated in the present specification.

As a preferred structure of the compound in which an alkoxymethyl group or a methylol group is bonded to a nitrogen atom, compounds represented by Formulae (100-1) to (100-4) can be mentioned. In the formulae, $R^7$ to $R^{11}$ each represent a hydrogen atom or a monovalent organic group. As the divalent organic group, the substituent T is preferable. $X^2$ is a single bond or a divalent linking group, and preferably a divalent linking group. As the divalent linking group, the linking group L is exemplified. In particular, $R^7$ is preferably an alkyl group and more preferably a methyl group.

(100-1)

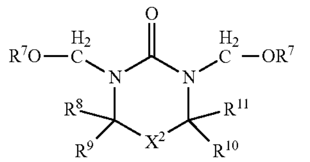

(100-2)

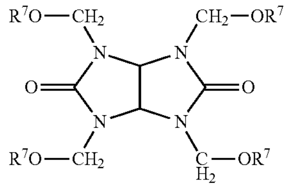

(100-3)

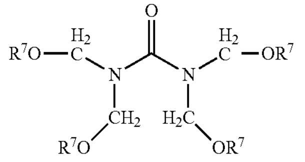

(100-4)

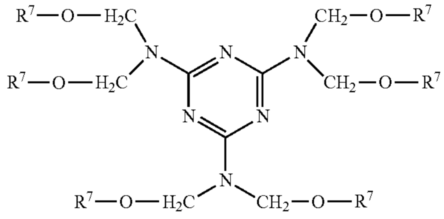

Examples of the compound in which an alkoxymethyl group or a methylol group is bonded to a carbon atom forming an aromatic ring include compounds represented by Formula (101-1) and Formula (101-2).

Formula (101-1)

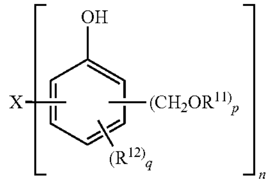

In Formula (101-1), X represents a single bond or a monovalent to tetravalent organic group, $R^{11}$ and $R^{12}$ each independently represent a hydrogen atom or a monovalent organic group, n is an integer of 1 to 4, and p and q are each independently an integer of 0 to 4.

Formula (101-2)

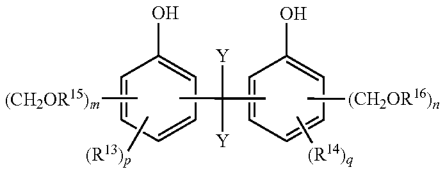

In Formula (101-2), two Y's each independently represent a hydrogen atom or an alkyl group, the alkyl group may contain an oxygen atom or a fluorine atom, $R^{13}$ to $R^{16}$ each independently represent a hydrogen atom or a monovalent organic group, m and n are each independently an integer of 1 to 3, and p and q are each independently an integer of 0 to 4.

Examples of commercially available products of the alkoxymethyl compound and the methylol compound include CYMEL 300, 301, 303, 370, 325, 327, 701, 266, 267, 238, 1141, 272, 202, 1156, 1158, 1123, 1170, and 1174, and UFR65 and 300 (all produced by Mitsui Cyanamid Co., Ltd.), and NIKALAC MX-750, -032, -706, -708, -40, -31, -270, -280, -290, and -750LM, NIKALAC MS-11, and NIKALAC MW-30HM, -100LM, and -390 (all produced by Sanwa Chemical Co., Ltd.).

(Blocked Isocyanate Compound)

The blocked isocyanate compound is preferably a compound having two or more blocked isocyanate groups in one molecule. For the details of the blocked isocyanate compound, reference can be made to the description in paragraphs 0151 to 0154 of JP2017-171784A, the contents of which are incorporated in the present specification.

<Other Components>

The composition for forming an underlayer film for imprinting according to the embodiment of the present invention may contain other components in addition to the aforementioned components.

Specifically, one or more kinds of a thermal acid generator, an alkylene glycol compound, a polymerization initiator, a solvent, a polymerization inhibitor, an antioxidant, a leveling agent, a thickener, a surfactant, or the like may be contained.

Regarding the aforementioned components, the respective components described in JP2013-036027A, JP2014-090133A, and JP2013-189537A can be used. Also regarding the content or the like, reference can be made to the description in the aforementioned publications.

In the present invention, it is particularly preferable to contain a solvent.

<<Thermal Acid Generator>>

The thermal acid generator is a compound which generates an acid by heating and advances crosslinking by the action of the acid. In a case of being used in combination with the crosslinking agent, an underlayer film having higher hardness can be obtained.

As the thermal acid generator, an organic onium salt compound in which a cationic component and an anionic component are paired is usually used. As the cationic component, for example, organic sulfonium, organic oxonium, organic ammonium, organic phosphonium, and organic iodonium can be mentioned. Moreover, as the anionic component, for example, $BF^{4-}$, $B(C_6F_5)^{4-}$, $SbF^{6-}$, $AsF^{6-}$, $PF^{6-}$, $CF_3SO_3^-$, $C_4F_9SO_3^-$, and $(CF_3SO_2)_3C^-$ can be mentioned.

Specifically, reference can be made to the description in paragraphs 0243 to 0256 of JP2017-224660A and paragraph 0016 of JP2017-155091A, the contents of which are incorporated in the present specification.

A content of the thermal acid generator is preferably 0.01 to 10 parts by mass and more preferably 0.1 to 5 parts by mass with respect to 100 parts by mass of the crosslinking agent. Only one kind or two or more kinds of the thermal acid generators may be used. In a case where two or more kinds thereof are used, the total amount thereof is preferably within the above range.

<<Polymerization Initiator>>

The composition for forming an underlayer film for imprinting may contain a polymerization initiator and preferably contains at least one kind of a thermal polymerization initiator or a photopolymerization initiator. By containing the polymerization initiator, a reaction of a polymerizable group contained in the composition for forming an underlayer film for imprinting tends is promoted, and thus the adhesiveness tends to be improved. From the viewpoint that crosslinking reactivity with the curable composition for imprinting is improved, a photopolymerization initiator is preferable. As the photopolymerization initiator, a radical polymerization initiator and a cationic polymerization initiator are preferable, and a radical polymerization initiator is more preferable. Moreover, in the present invention, a plurality of kinds of photopolymerization initiators may be used in combination.

As a radical polymerization initiator, known compounds can be optionally used. Examples thereof include a halogenated hydrocarbon derivative (for example, a compound having a triazine skeleton, a compound having an oxadiazole skeleton, a compound having a trihalomethyl group, and the like), an acylphosphine compound such as acylphosphine oxide, hexaarylbiimidazole, an oxime compound such as an oxime derivative, an organic peroxide, a thio compound, a ketone compound, an aromatic onium salt, ketoxime ether, an aminoacetophenone compound, hydroxyacetophenone, an azo-based compound, an azide compound, a metallocene compound, an organic boron compound, and an iron arene complex. For the details thereof, reference can be made to the description in paragraphs 0165 to 0182 of JP2016-027357A, the contents of which are incorporated in the present specification.

Examples of the acylphosphine compound include 2,4,6-trimethylbenzoyl-diphenyl-phosphine oxide. Moreover, IRGACURE-819, IRGACURE 1173, and IRGACURE- TPO (trade names: all are produced by BASF SE), which are commercially available products, can be used.

In a case where the photopolymerization initiator used in the composition for forming an underlayer film for imprinting is formulated, a content thereof in the solid content is, for example, 0.0001% to 5% by mass, preferably 0.0005% to 3% by mass, and more preferably 0.01% to 1% by mass. In a case where two or more kinds of photopolymerization initiators are used, the total amount thereof is within the above range.

<Solvent>

The composition for forming an underlayer film for imprinting preferably contains a solvent (hereinafter, referred to as a "solvent for an underlayer film" in some cases). For example, the solvent is preferably a compound which is liquid at 23° C. and has a boiling point of 250° C. or lower. A content of the solvent for an underlayer film in the composition for forming an underlayer film for imprinting is preferably 99.0% by mass or greater and more preferably 99.2% by mass or greater, and may be 99.4% by mass or greater. That is, the concentration of the solid content in the composition for forming an underlayer film for imprinting is preferably 1% by mass or lower, more preferably 0.8% by mass or lower, and still more preferably 0.6% by mass or lower. Moreover, the lower limit value thereof is preferably higher than 0% by mass, more preferably 0.001% by mass or higher, still more preferably 0.01% by mass or higher, and even more preferably 0.1% by mass or higher. By setting the proportion of the solvent within the above range, a film thickness during film formation is kept thin, and thus pattern formability during etching processing tends to be improved.

The composition for forming an underlayer film for imprinting may contain only one kind or two or more kinds of the solvents. In a case where two or more kinds thereof are contained, the total amount thereof is preferably within the above range.

The boiling point of the solvent for an underlayer film is preferably 230° C. or lower, more preferably 200° C. or lower, still more preferably 180° C. or lower, even more preferably 160° C. or lower, and further still more preferably 130° C. or lower. The lower limit value thereof is practically 23° C. but more practically 60° C. or higher. By setting the boiling point within the above range, the solvent can be easily removed from the underlayer film, which is preferable.

The solvent for an underlayer film is preferably an organic solvent. The solvent is preferably a solvent having any one or more of an ester group, a carbonyl group, a hydroxyl group, and an ether group. Among them, an aprotic polar solvent is preferably used.

As specific examples thereof, alkoxy alcohol, propylene glycol monoalkyl ether carboxylate, propylene glycol monoalkyl ether, lactate, acetate, alkoxypropionate, chain-like ketone, cyclic ketone, lactone, and alkylene carbonate are selected.

Examples of the alkoxy alcohol include methoxyethanol, ethoxyethanol, methoxypropanol (for example, 1-methoxy-2-propanol), ethoxypropanol (for example, 1-ethoxy-2-propanol), propoxypropanol (for example, 1-propoxy-2-propanol), methoxybutanol (for example, 1-methoxy-2-butanol and 1-methoxy-3-butanol), ethoxybutanol (for example, 1-ethoxy-2-butanol and 1-ethoxy-3-butanol), and methylpentanol (for example, 4-methyl-2-pentanol).

As the propylene glycol monoalkyl ether carboxylate, at least one selected from the group consisting of propylene glycol monomethyl ether acetate (PGMEA), propylene glycol monomethyl ether propionate, and propylene glycol monoethyl ether acetate is preferable, and propylene glycol monomethyl ether acetate is particularly preferable.

In addition, as the propylene glycol monoalkyl ether, propylene glycol monomethyl ether (PGME) or propylene glycol monoethyl ether is preferable.

As the lactate, ethyl lactate, butyl lactate, or propyl lactate is preferable.

As the acetate, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

As the alkoxypropionate, methyl 3-methoxypropionate (MMP) or ethyl 3-ethoxypropionate (EEP) is preferable.

As the chain-like ketone, 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetylacetone, acetonylacetone, ionone, diacetonyl alcohol, acetylcarbinol, acetophenone, methyl naphthyl ketone, or methyl amyl ketone is preferable.

As the cyclic ketone, methylcyclohexanone, isophorone, or cyclohexanone is preferable.

As the lactone, γ-butyrolactone (γBL) is preferable.

As the alkylene carbonate, propylene carbonate is preferable.

In addition to the aforementioned components, an ester-based solvent having 7 or more (preferably 7 to 14, more preferably 7 to 12, and still more preferably 7 to 10) carbon atoms and having 2 or less heteroatoms is preferably used.

Preferred examples of the ester-based solvent having 7 or more carbon atoms and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is particularly preferably used.

Examples of a preferred solvent among the solvents for an underlayer film include alkoxy alcohol, propylene glycol monoalkyl ether carboxylate, propylene glycol monoalkyl ether, lactate, acetate, alkoxypropionate, chain-like ketone, cyclic ketone, lactone, and alkylene carbonate, and propylene glycol monoalkyl ether and lactone are particularly preferable.

<Storage Container>

As a storage container of the composition for forming an underlayer film for imprinting, storage containers known in the related art can be used. Moreover, as the storage container, for the purpose of preventing impurities from being mixed into a raw material or a composition, a multilayer bottle having a container inner wall made of six layers of six kinds of resins or a bottle having a seven-layer structure of six kinds of resins is also preferably used. Examples of such a container include the container described in JP2015-123351A. A storage container subjected to an acid cleaning treatment is preferable.

<Surface Free Energy>

Surface free energy of an underlayer film for imprinting which is formed of the composition for forming an underlayer film for imprinting according to the embodiment of the present invention is preferably 30 mN/m or greater, more preferably 40 mN/m or greater, and still more preferably 50 mN/m or greater. The upper limit thereof is preferably 200 mN/m or less, more preferably 150 mN/m or less, and still more preferably 100 mN/m or less.

The surface free energy can be measured at 23° C. using a surface tensiometer SURFACE TENS-IOMETER CBVP-A3 manufactured by Kyowa Interface Science Co., LTD. and a glass plate.

<Method for Producing Composition for Forming Underlayer Film for Imprinting>

The composition for forming an underlayer film for imprinting according to the embodiment of the present invention is prepared by formulating raw materials in a predetermined ratio. The raw materials refer to components which are actively formulated in the composition for forming an underlayer film for imprinting, and in which unintentionally contained components such as impurities are excluded. Specifically, a curable component and a solvent are exemplified. Here, the raw materials may be commercially available products or synthetic products. All the raw materials usually contain particles (the specific particulate metal, metal particles other than the specific particulate metal, or other impurities) containing impurities, and the like.

As one preferred embodiment of a method for producing the composition for forming an underlayer film for imprinting according to the embodiment of the present invention, a production method including subjecting at least one kind of raw materials contained in the composition for forming an underlayer film for imprinting to a filtration treatment with a filter can be mentioned. Moreover, it is also preferable that two or more kinds of raw materials are mixed, then filtered with a filter, and mixed with other raw materials (may or may not be filtered). As one more preferred embodiment thereof, an embodiment in which raw materials (preferably, all raw materials) contained in the composition for forming an underlayer film for imprinting are mixed, and then subjected to a filtration treatment with a filter is exemplified.

The filter is preferably a filter containing polyamide.

Effects of filtration are exhibited even with one stage of a filter, but filtration with two or more stages of filters is more preferable. The filtration with two or more stages of filters refers to filtration in a state where two or more filters are arranged in series. In the present invention, filtration with one to five stages of filters is preferable, filtration with one to four stages of filters is more preferable, and filtration with two to four stages of filters is still more preferable.

The method for producing the composition for forming an underlayer film for imprinting according to the embodiment of the present invention includes mixing raw materials of the composition for forming an underlayer film for imprinting and then filtering the mixture with two or more kinds of filters, and it is preferable that pore diameters of at least two kinds among the two or more kinds of filters are different from each other. With such a configuration, the specific particulate metal or the like can be more effectively removed. Moreover, it is preferable that materials of at least two kinds among the two or more kinds of filters are different from each other. With such a configuration, much more kinds of the specific particulate metals or the like can be removed.

Furthermore, it is preferable to perform filtration by passing the composition for forming an underlayer film for imprinting through filters in order from a filter having the largest pore diameter among the two or more kinds of filters. That is, it is preferable to arrange the filters so that pore diameters are decreased from the upstream to the downstream of a filtration device, from the viewpoint of a particulate metal-removing ability.

Among the two or more kinds of filters, a pore diameter $X^1$ of a filter having the smallest pore diameter is preferably 0.5 to 15 nm, more preferably 1 to 10 nm, and still more preferably 1 to 5 nm. By setting the pore diameter $X^1$ to 0.5 nm or larger, a filtration rate is improved, and thus productivity tends to be improved. Moreover, it is possible to more effectively suppress breakage of a filter due to an increase in a filtration supply pressure, or elution of impurities from the filter material. Meanwhile, by setting the pore diameter $X^1$ to 15 nm or smaller, the specific particulate metal or the like can be more effectively removed. Here, a filter having the smallest pore diameter $X^1$ is called a filter A, a group of other filters is called a filter BU.

In addition, among the two or more kinds of filters, a pore diameter $X^2$ of a filter having the largest pore diameter is preferably 5 to 100 nm, more preferably 7 to 80 nm, and still more preferably 10 to 50 nm. Here, the pore diameter $X^2$ is not smaller than the pore diameter $X^1$. By setting the pore diameter $X^2$ to 5 nm or larger, a filtration rate is improved, and thus productivity tends to be improved. Moreover, it is possible to more effectively suppress breakage of a filter due to an increase in a filtration supply pressure, or elution of impurities from the filter material. Meanwhile, by setting the pore diameter $X^2$ to 100 nm or smaller, the filter BU or the filter A is clogged, and thus productivity tends to be remarkably improved.

A difference between the pore diameter $X^1$ and the pore diameter $X^2$ is preferably larger than 0 and 200 nm or smaller, more preferably 3 to 100 nm, and still more preferably 10 to 50 nm. By setting the difference within the above range, the particulate metal can be efficiently removed while maintaining productivity.

In a case where two kinds of filters having different pore diameters are used, a filter having a pore diameter of 0.5 to 15 nm (preferably, a filter having a pore diameter of 1 to 10 nm) can be used in first-stage filtration, and a filter having a pore diameter of 3 to 100 nm (preferably, a filter having a pore diameter of 5 to 50 nm) can be used in second-stage filtration.

In a case where three kinds of filters having different pore diameters are used, a filter having a pore diameter of 0.5 to 15 nm (preferably, a filter having a pore diameter of 1 to 10 nm) can be used in first-stage filtration, a filter having a pore diameter of 3 to 100 nm (preferably, a filter having a pore diameter of 5 to 50 nm) can be used in second-stage filtration, and a filter having a pore diameter of 10 to 150 nm (preferably, a filter having a pore diameter of 30 to 100 nm) can be used in third-stage filtration. Moreover, a difference in the pore diameter of the filter from the immediately preceding stage, such as between the first stage and the second stage and between the second stage and the third stage, is preferably 5 to 20 nm.

A component (material component) constituting the material for the filter preferably contains a resin. The resin is not particularly limited, and resins known as the material for the filter can be used. Specific examples thereof include polyamide such as 6-polyamide and 6,6-polyamide, polyolefin such as polyethylene and polypropylene, polystyrene, polyimide, polyamide imide, poly(meth)acrylate, polyfluorocarbon such as polytetrafluoroethylene, perfluoroalkoxy alkane, a perfluoroethylenepropene copolymer, an ethylene-tetrafluoroethylene copolymer, an ethylene-chlorotrifluoroethylene copolymer, polychlorotrifluoroethylene, polyvinylidene fluoride, and polyvinyl fluoride, polyvinyl alcohol, polyester, cellulose, cellulose acetate, polysulfone, and polyether sulfone. Among them, from the viewpoints that superior solvent resistance is exhibited and a superior defect-suppressing performance is exhibited, at least one kind selected from the group consisting of polyamide (in particular, 6,6-polyamide is preferable), polyolefin (in particular, polyethylene is preferable), polyfluorocarbon (in particular, polytetrafluoroethylene (PTFE) and perfluoroalkoxy alkane (PFA) are preferable), polystyrene, polysulfone, and polyether sulfone is preferable, at least one kind selected from the group consisting of polyolefin, polyamide, and polytetrafluoroethylene is more preferable, at least one kind selected from the group consisting of polyethylene (including polyethylene having an ultra-high molecular weight and grafted polyethylene), polyamide, and polytetrafluoroethylene is still more preferable, at least one kind selected from the group consisting of polyethylene (including polyethylene having an ultra-high molecular weight and grafted polyethylene) and polyamide is even more preferable, and a polyamide is further still more preferable. These polymers can be used singly or in combination of two or more kinds thereof.

In addition, as one preferred embodiment of the component (material component) constituting the material for the filter, a polymer (grafted polymer) in which at least one kind of a neutral group or an ion exchange group is grafted can be mentioned. The neutral group and the ion exchange group are each preferably at least one kind selected from a hydroxyl group or a carboxyl group, and more preferably a hydroxyl group.

The grafted polymer is preferably a grafted polyolefin and more preferably a grafted polyethylene.

Furthermore, as one preferred embodiment of the component (material component) constituting the material for the filter, the component may coat or be supported on a porous film formed of another resin. A filter, which is coated with and supports the material, improves mobility of a functional group that adsorbs the specific particulate metal and the particles including a metal other than the specific particulate metal, and thus an ability to capture the specific particulate metal and the particulate metal including a metal other than the specific particulate metal is extremely high.

For the description of the grafted polymer, reference can be made to the description in WO2016/081729A, the contents of which are incorporated in the present specification.

In the present invention, it is preferable that among the two or more kinds of filters, at least one kind contains a resin having an adsorptive group capable of adsorbing at least one kind of iron, copper, titanium, or lead. The adsorptive group capable of adsorbing at least one kind of iron, copper, titanium, or lead is preferably an adsorptive group capable of further adsorbing at least one kind of sodium, potassium, calcium, magnesium, manganese, aluminum, lithium, chromium, nickel, tin, zinc, arsenic, silver, gold, cadmium, cobalt, vanadium, or tungsten. Examples of the adsorptive group include a hydroxyl group, a carboxyl group, a phosphoric acid group, a phosphonic acid group, a sulfonic acid group, and an amide group.

In the present invention, it is particularly preferable that the resin having an adsorptive group is polyamide.

Furthermore, an effective filtration area of the filter used in the present invention is preferably 100 to 1,000 $cm^2$ and more preferably 500 to 1,000 $cm^2$. By using such a filter, productivity can be improved.

A supply pressure of the composition for forming an underlayer film for imprinting to the filter is not particularly limited, but is generally preferably 0.001 to 2.0 MPa. Among them, from the viewpoint that the specific particulate metal can be more effectively removed, the supply pressure is preferably 0.001 to 1.5 MPa, more preferably 0.01 to 1.2 MPa, still more preferably 0.05 to 1.0 MPa, and even more preferably 0.1 to 1.0 MPa.

Furthermore, since the filtration pressure affects filtration accuracy, it is preferable that the pressure pulsation during filtration is as small as possible. Differential pressure resistance which ensures a filter performance (the filter is not broken) is set for the filter, and in a case where the value is large, the filtration pressure is increased, and thus the filtration rate can be increased. That is, the upper limit of the filtration rate usually depends on the differential pressure resistance of the filter, but is usually preferably 10.0 L/min or lower, more preferably 1.0 L/min or lower, and still more preferably 0.5 L/min or lower. The lower limit value thereof is, for example, 0.001 L/min or higher, more preferably 0.01 L/min or higher, still more preferably 0.1 L/min or higher, and even more preferably 0.25 L/min or higher.

A temperature in a case where the composition for forming an underlayer film for imprinting is passed through the filter is not particularly limited, but is generally preferably about room temperature (for example, 15° C. to 30° C., and further 20° C. to 25° C.).

In addition, a filtration step is preferably performed in a clean environment. Specifically, the filtration step is preferably performed in a clean room satisfying Class 1000 (Class 6 in ISO 14644-1:2015) of Federal Specifications and Standards (Fed. Std. 209E), and a clean room satisfying Class 100 (Class 5 in ISO 14644-1:2015) is more preferable, a clean room satisfying Class 10 (Class 4 in ISO 14644-1:2015) is still more preferable, and a clean room having a cleanliness (Class 2 or Class 1) of Class 1 (Class 3 in ISO 14644-1:2015) or higher is particularly preferred.

The raw materials contained in the composition for forming an underlayer film for imprinting used in the present invention, for example, the compound which is a liquid at 23° C. and the solvent may be subjected to a distillation treatment before the aforementioned filtration, but it is preferable that the raw materials are not subjected to the distillation treatment. In a case where the raw materials are subjected to the distillation treatment, the number of times of the filtration can be more effectively reduced. On the other hand, in a case where the raw materials are not subjected to the distillation treatment, the cost of the material can be reduced.

The production method according to the embodiment of the present invention is also suitable for a method for producing the composition for forming an underlayer film for imprinting, which does not substantially contain a silicon atom. The expression "not substantially contain" means that a content of silicon is 3% by mass or less with respect to the curable component contained in the composition for forming an underlayer film for imprinting, and the content is preferably 1% by mass or less and more preferably 0.1% by mass or less.

The method for producing the composition for forming an underlayer film for imprinting according to the present embodiment may include steps other than the aforementioned steps. Examples of the steps other than the aforementioned steps include a filter cleaning step, a device cleaning step, an electricity removing step, and a purified liquid preparation step.

<Curable Composition for Imprinting>

The composition for forming an underlayer film for imprinting is usually used as a composition for forming an underlayer film formed of the curable composition for imprinting. A cured product formed of the composition for forming an underlayer film for imprinting according to the embodiment of the present invention is usually used as an underlayer film.

The curable composition for imprinting used in the present invention can adopt an aspect in which a particulate metal (hereinafter, called a "particulate metal A" in some cases) which has a particle diameter of 1 nm or larger, as measured by the single particle ICP-MASS method, and includes at least one kind of iron, copper, titanium, or lead is contained in a proportion of 100 ppt by mass to 30 ppb by mass in total with respect to the composition.

It is presumed that by setting amount of the particulate metal A within the above range as described above, damage to a mold can be effectively suppressed, and mold durability can be improved.

The particlate matal A is not particularly specified as long as the particle is a particulate metal including at least one kind of iron, copper, titanium, or lead, and is intended to also include a particulate metal consisting of two or more kinds of iron, copper, titanium, and lead, a particulate metal consisting of at least one kind of iron, copper, titanium, or lead and another metal, and a particulate metal consisting of at least one kind of iron, copper, titanium, or lead and a nonmetal.

The lower limit value of a content of the particulate metal A is preferably 150 ppt by mass or greater and more preferably 200 ppt by mass or greater. Moreover, the upper limit value of the content of the particulate metal A is preferably 25 ppb by mass or less, more preferably 19 ppb by mass or less, still more preferably 15 ppb by mass or less, even more preferably 10 ppb by mass or less, further still more preferably 8 ppb by mass or less, further still more preferably 5 ppb by mass or less, and further still more preferably 3 ppb by mass or less, and may be 1.5 ppb by mass or less or 1 ppb by mass or less. As described above, by setting the amount of the particulate metal A to 30 ppb by mass or less, damage to the mold (in particular, damage to the mold pattern) can be suppressed. Meanwhile, by setting the amount to 100 ppt by mass or greater, contamination of the mold in a case where imprinting is repeatedly performed can be effectively suppressed.

The amount and the particle diameter of the particulate metal A are measured by the methods described in Examples described later.

The curable composition for imprinting contains a particulate metal (hereinafter, referred to as a "particulate metal B" in some cases) which is other than the aforementioned particulate metal A, has a particle diameter of 1 nm or larger, as measured by the single particle ICP-MASS method, and includes at least one kind of sodium, potassium, calcium, magnesium, manganese, aluminum, lithium, chromium, nickel, tin, zinc, arsenic, silver, gold, cadmium, cobalt, vanadium, or tungsten, and a total amount thereof is preferably 150 ppt by mass to 60 ppb by mass with respect to the solid content. With such a configuration, the effects of the present invention are more effectively exhibited. Moreover, releasability can also be improved.

The lower limit value of a total content of the particulate metal A and the particulate metal B is preferably 0.2 ppb by mass or greater and more preferably 0.3 ppb by mass or greater. Moreover, the upper limit value thereof is preferably 100 ppb by mass or less, more preferably 50 ppb by mass or less, still more preferably 10 ppb by mass or less, and even more preferably 5 ppb by mass or less.

The amount and the particle diameter of particulate metal B are measured by the method described in Examples described later.

The curable composition for imprinting preferably contains at least two kinds of sodium, potassium, calcium, magnesium, manganese, aluminum, lithium, chromium, nickel, tin, zinc, arsenic, silver, gold, cadmium, cobalt, vanadium, or tungsten, more preferably contains at least three kinds among them, still more preferably contains at least four kinds among them, and even more preferably contains all the metals, as the particulate metal including a metal other than the particulate metal A. With such a configuration, the mold durability tends to be further improved.

The composition or the like of the curable composition for imprinting is not particularly specified, but the curable composition for imprinting preferably contains a polymerizable compound and a photopolymerization initiator.

<<Polymerizable Compound>>

The curable composition for imprinting preferably contains a polymerizable compound, and it is more preferable that the polymerizable compound constitutes the maximum-amount component. The polymerizable compound may have one polymerizable group or two or more polymerizable groups in one molecule. At least one kind of polymerizable compounds contained in the curable composition for imprinting preferably has two to five polymerizable groups, more preferably has two to four polymerizable groups, still more preferably has two or three polymerizable groups, and even more preferably has three polymerizable groups, in one molecule.

At least one kind of the polymerizable compounds contained in the curable composition for imprinting preferably contains at least one of an aromatic ring (the number of the carbon atoms is preferably 6 to 22, more preferably 6 to 18, and still more preferably 6 to 10) or an alicycle (the number of the carbon atoms is preferably 3 to 24, more preferably 3 to 18, and still more preferably 3 to 6), and more preferably contains an aromatic ring. The aromatic ring is preferably a benzene ring.

The molecular weight of the polymerizable compound is preferably 100 to 900.

The at least one kind of polymerizable compounds is preferably represented by Formula (I-1).

(I-1)

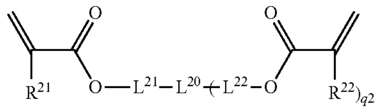

$L^{20}$ is a (1+q2)-valent linking group, and examples thereof include a (1+q2)-valent group (the number of the carbon atoms is preferably 1 to 12, more preferably 1 to 6, and still more preferably 1 to 3) having an alkane structure, a (1+q2)-valent group (the number of the carbon atoms is preferably 2 to 12, more preferably 2 to 6, and still more preferably 2 or 3) having an alkene structure, a (1+q2)-valent group (the number of the carbon atoms is preferably 6 to 22, more preferably 6 to 18, and still more preferably 6 to 10) having an aryl structure, a (1+q2)-valent group (the number of the carbon atoms is preferably 1 to 22, more preferably 1 to 18, and still more preferably 1 to 10, examples of a heteroatom include a nitrogen atom, a sulfur atom, and an oxygen atom, and a 5-membered ring, a 6-membered ring, and a 7-membered ring are preferable) having a heteroaryl structure, and a linking group including a group obtained by combining these groups. Examples of the group in which two aryl groups are combined include groups having a structure such as biphenyl, diphenylalkane, biphenylene, and indene. Examples of a combination of the group having a heteroaryl structure and the group having an aryl structure include groups having a structure such as indole, benzimidazole, quinoxaline, and carbazole.

$R^{21}$ and $R^{22}$ each independently represent a hydrogen atom or a methyl group.

$L^{21}$ and $L^{22}$ each independently represent a single bond or the linking group L, and among them, a linking group having a heteroatom is preferable. $L^{20}$ and $L^{21}$ or $L^{22}$ may be bonded to each other via or without via the linking group L to form a ring. $L^{20}$, $L^{21}$, and $L^{22}$ may have the substituent T. A plurality of substituents T may be bonded to each other to form a ring. In a case where there are the plurality of substituents T, the plurality of substituents T may be the same as or different from each other.

q2 is an integer of 0 to 5, preferably an integer of 0 to 3, more preferably an integer of 0 to 2, and still more preferably 0 or 1.

Examples of the polymerizable compound include compounds used in the following Examples, the compounds described in paragraphs 0017 to 0024 and Examples of JP2014-090133A, the compounds described in paragraphs 0024 to 0089 of JP2015-009171A, the compounds described in paragraphs 0023 to 0037 of JP2015-070145A, and the compounds described in paragraphs 0012 to 0039 of WO2016/152597A, but the present invention is not construed as being limited to these examples.

The content of the polymerizable compound in the curable composition for imprinting is preferably 30% by mass or greater, more preferably 45% by mass or greater, still more preferably 50% by mass or greater, and even more preferably 55% by mass or greater, and may be 60% by mass or greater or further 70% by mass or greater. Moreover, the upper limit value thereof is preferably less than 99% by mass and more preferably 98% by mass or less, and can also be 97% by mass or less.

<<Other Components>>

The curable composition for imprinting may contain additives other than the polymerizable compound. A polymerization initiator, a surfactant, a sensitizer, a release agent, an antioxidant, a polymerization inhibitor, or the like may be contained as other additives.

Specific examples of the curable composition for imprinting which can be used in the present invention include the compositions described in JP2013-036027A, JP2014-090133A, and JP2013-189537A, the contents of which are incorporated in the present specification. Moreover, also regarding preparation of the curable composition for imprinting and a method for forming a film (pattern forming layer), reference can be made to the description in the aforementioned publications, the contents of which are incorporated in the present specification.

In the present invention, a content of the solvent in the curable composition for imprinting is preferably 5% by mass or less, more preferably 3% by mass or less, and still more preferably 1% by mass or less with respect to the curable composition for imprinting.

The curable composition for imprinting can adopt an aspect in which a polymer (a polymer having preferably a weight-average molecular weight of greater than 1,000, more preferably a weight-average molecular weight of greater than 2,000, and still more preferably a weight-average molecular weight of 10,000 or greater) is not substantially contained. The expression "polymer is not substantially contained" means, for example, that the content of the polymer is 0.01% by mass or less with respect to the curable composition for imprinting, and it is preferable that the content is 0.005% by mass or less and more preferable that the polymer is not contained at all.

<<Physical Property Value or the Like>>

A viscosity of the curable composition for imprinting is preferably 20.0 mPa·s or lower, more preferably 15.0 mPa·s or lower, still more preferably 11.0 mPa·s or lower, and even more preferably 9.0 mPa·s or lower. The lower limit value of the viscosity is not particularly limited, but can be, for example, 5.0 mPa·s or higher. The viscosity is measured according to the following method.

The viscosity is measured using an E-type rotational viscometer RE85L manufactured by TOKI SANGYO CO., LTD. and a standard cone rotor (1° 34'×$R^{24}$) in a state where a temperature of a sample cup is adjusted to 23° C. The unit is mPa·s. Other details regarding the measurement are in accordance with JIS Z 8803:2011. Two samples are produced for one level and are respectively measured three times. An arithmetic mean value of a total of six times is adopted as an evaluation value.

Surface tension (γResist) of the curable composition for imprinting is preferably 28.0 mN/m or higher and more preferably 30.0 mN/m or higher, and may be 32.0 mN/m or higher. By using the curable composition for imprinting which has high surface tension, a capillary force is increased and thus high-speed filling of a mold pattern with the curable composition for imprinting is possible. The upper limit value of the surface tension is not particularly limited, but from the viewpoints of a relationship with the underlayer film and imparting ink jet suitability, is preferably 40.0 mN/m or lower and more preferably 38.0 mN/m or lower, and may be 36.0 mN/m or lower. In the present invention, the surface tension is measured according to the following method.

<<<Surface Tension>>>

The surface tension is measured at 23° C. using a surface tensiometer SURFACE TENS-IOMETER CBVP-A3 manufactured by Kyowa Interface Science Co., LTD. and a glass plate. The unit is mN/m. Two samples are produced for one level and are respectively measured three times. An arithmetic mean value of a total of six times is adopted as an evaluation value.

An Ohnishi parameter of the curable composition for imprinting is preferably 5.0 or less, more preferably 4.0 or less, and still more preferably 3.7 or less. The lower limit value of the Ohnishi parameter of the curable composition for imprinting is not particularly specified, but may be, for example, 1.0 or greater or further 2.0 or greater.

For each of the non-volatile components of the curable composition for imprinting, the Ohnishi parameter can be determined by substituting the number of carbon atoms, the number of hydrogen atoms, and the number of oxygen atoms in all constituent components into the following expression.

Ohnishi parameter=sum of number of carbon atoms, number of hydrogen atoms, and number of oxygen atoms/(number of carbon atoms−number of oxygen atoms)

<<Storage Container>>

As a storage container of the curable composition for imprinting used in the present invention, storage containers known in the related art can be used. Moreover, as the storage container, for the purpose of preventing impurities from being mixed into a raw material or a composition, a multilayer bottle having a container inner wall made of six layers of six kinds of resins or a bottle having a seven-layer structure of six kinds of resins is also preferably used. Examples of such a container include the container described in JP2015-123351A. A storage container subjected to an acid cleaning treatment is preferable.

<Kit>

A kit according to the embodiment of the present invention includes the composition for forming an underlayer film for imprinting according to the embodiment of the present invention, and the curable composition for imprinting. The curable composition for imprinting is a curable composition for imprinting containing a polymerizable compound and particulate metals which have a particle diameter of 1 nm or larger, as measured by the single particle ICP-MASS method, and include at least one kind of iron, copper, titanium, or lead, in which a total content of the particulate metals is preferably 100 ppt by mass to 30 ppb by mass with respect to a solid content of the curable composition for imprinting. The details of the curable composition for imprinting are the same as described above, and preferred ranges thereof are also the same.

<Pattern and Pattern Producing Method>

A pattern producing method according to the preferred embodiment of the present invention includes a step (underlayer film formation step) of applying the composition for forming an underlayer film for imprinting according to the embodiment of the present invention to a substrate to form an underlayer film for imprinting; a step (step for forming a layer of a curable composition for imprinting) of applying the curable composition for imprinting onto the underlayer film for imprinting (preferably, a surface of the underlayer film); a step of exposing the curable composition for imprinting in a state where a mold is in contact with the curable composition for imprinting; and a step of peeling off the mold.

Hereinafter, the pattern producing method will be described with reference to FIGS. 1A to 1G. It goes without saying that the configuration of the present invention is not limited by the drawings.

<<Underlayer Film Formation Step>>

In the underlayer film formation step, as shown in FIGS. 1A and 1B, an underlayer film 2 is formed on a surface of a substrate 1. The underlayer film is preferably formed by applying the composition for forming an underlayer film for imprinting in a layer form onto the substrate. The substrate 1 may have an undercoat layer or an adhesive film in addition to a case where the substrate 1 consists of a single layer.

A method for applying the composition for forming an underlayer film for imprinting onto the surface of the substrate is not particularly specified, and generally well-known application methods can be adopted. Specific examples of the application method include a dip coating method, an air knife coating method, a curtain coating method, a wire bar coating method, a gravure coating method, an extrusion coating method, a spin coating method, a slit scanning method, and an ink jet method, and a spin coating method is preferable.

Furthermore, after the composition for forming an underlayer film for imprinting is applied in a layer form onto the substrate, preferably, the solvent is volatilized (dried) by heat to form an underlayer film which is a thin film.

A thickness of the underlayer film 2 is preferably 2 nm or greater, more preferably 3 nm or greater, and still more preferably 4 nm or greater, and may be 5 nm or greater. Moreover, the thickness of the underlayer film is preferably 40 nm or less, more preferably 30 nm or less, and still more preferably 20 nm or less, and may be 15 nm or less. By setting the film thickness to be equal to or greater than the lower limit value, extendability (wettability) of the curable composition for imprinting on the underlayer film is improved, and a uniform residual film can be formed after imprinting. By setting the film thickness to be equal to or less than the upper limit value, the thickness of the residual film after imprinting is reduced, unevenness in the film thickness is less likely to occur, and thus uniformity of the residual film tends to be improved.

A material of the substrate is not particularly specified, reference can be made to the description in paragraph 0103 of JP2010-109092A, the contents of which are incorporated in the present specification. In the present invention, a silicon substrate, a glass substrate, a quartz substrate, a sapphire substrate, a silicon carbide (silicon carbide) substrate, a gallium nitride substrate, an aluminum substrate, an amorphous aluminum oxide substrate, a polycrystalline aluminum oxide substrate, and a substrate made of spin-on carbon (SOC), spin-on glass (SOG), silicon nitride, silicon oxynitride, GaAsP, GaP, AlGaAs, InGaN, GaN, AlGaN, ZnSe, AlGa, InP, or ZnO can be mentioned. Furthermore, specific examples of a material of the glass substrate include aluminosilicate glass, aluminoborosilicate glass, and barium borosilicate glass. In the present invention, a silicon substrate and a substrate coated with spin-on carbon (SOC) are preferable.

In the present invention, it is preferable to use a substrate having an organic layer as an outermost layer.

Examples of the organic layer of the substrate include an amorphous carbon film formed by chemical vapor deposition (CVD), and a spin-on carbon film formed by dissolving a high-carbon material in an organic solvent and performing spin coating. Examples of the spin-on carbon film include a nortricyclene copolymer, a hydrogenated naphthol novolac resin, a naphthol dicyclopentadiene copolymer, a phenol dicyclopentadiene copolymer, the fluorene bisphenol novolac described in JP2005-128509A, the acenaphthylene copolymer described in JP2005-250434A, an indene copolymer, the fullerene having a phenol group described in JP2006-227391A, a bisphenol compound and a novolac resin thereof, a dibisphenol compound and a novolac resin thereof, a novolac resin of an adamantane phenol compound, a hydroxyvinylnaphthalene copolymer, the bisnaphthol compound and the novolac resin thereof described in JP2007-199653A, and resin compounds shown in ROMP and a tricyclopentadiene copolymer.

For examples of the SOC, reference can be made to the description in paragraph 0126 of JP2011-164345A, the contents of which are incorporated in the present specification.

<<Step for Forming Layer of Curable Composition for Imprinting>>

In the step for forming a layer of a curable composition for imprinting, for example, as shown in FIG. 1C, a curable composition 3 for imprinting is applied to the surface of the underlayer film 2.

A method for applying the curable composition for imprinting is not particularly specified, reference can be made to the description in paragraph 0102 of JP2010-109092A, the contents of which are incorporated in the present specification. The curable composition for imprinting is preferably applied onto the surface of the underlayer film by an ink jet method. Moreover, the curable composition for imprinting may be applied through multiple applying. In a method for arranging liquid droplets on the surface of the underlayer film by the ink jet method or the like, an amount of the liquid droplets is preferably about 1 to 20 pL, and the liquid droplets are preferably arranged on the surface of the underlayer film at an interval between liquid droplets. The interval between liquid droplets is preferably an interval of 10 to 1,000 m. In a case of the ink jet method, the interval between liquid droplets is an arrangement interval between ink jet nozzles.

Furthermore, a volume ratio of the underlayer film 2 to the film-like curable composition 3 for imprinting applied onto the underlayer film is preferably 1:1 to 500, more preferably 1:10 to 300, and still more preferably 1:50 to 200.

In addition, in the present invention, it is preferable to include a step of applying the curable composition for imprinting in a layer form onto a substrate, and include heating (baking) the curable composition for imprinting applied in a layer form preferably at 100° C. to 300° C., more preferably at 130° C. to 260° C., and still more preferably at 150° C. to 230° C. A heating time is preferably 30 seconds to 5 minutes.

<<Mold Contact Step>>

In the mold contact step, for example, as shown in FIG. 1D, the curable composition 3 for imprinting is brought into contact with a mold 4 having a pattern for transferring a pattern shape. Through such a step, a desired pattern (imprint pattern) is obtained.

Specifically, in order to transfer a desired pattern to the film-like curable composition for imprinting, the mold 4 is pressed against the surface of the film-like curable composition 3 for imprinting.

The mold may be a light-transmitting mold or a non-light-transmitting mold. In a case where the light-transmitting mold is used, it is preferable that the curable composition 3 for imprinting is irradiated with light from a mold side. In the present invention, it is more preferable that the light-transmitting mold is used and light is radiated from the mold side.

A mold which can be used in the present invention is a mold having a pattern to be transferred. The pattern of the mold can be formed according to a desired processing accuracy, for example, by photolithography, electron beam lithography, or the like, but in the present invention, a mold pattern producing method is not particularly limited. Moreover, a pattern formed by the pattern producing method according to the preferred embodiment of the present invention can be used as a mold.

A material constituting the light-transmitting mold used in the present invention is not particularly limited, but examples thereof include glass, quartz, a light-transmitting resin such as polymethyl methacrylate (PMMA) and a polycarbonate resin, a transparent metal vapor-deposited film, a flexible film such as polydimethylsiloxane, a photo-cured film, and a metal film, and quartz is preferable.

A non-light-transmission-type mold material used in a case where a light-transmitting substrate is used in the present invention is not particularly limited, but may be any material having a predetermined strength. Specific examples thereof include a ceramic material, a vapor-deposited film, a magnetic film, a reflective film, a substrate made of a metal such as Ni, Cu, Cr, and Fe, and a substrate made of SiC, silicon, silicon nitride, polysilicon, silicon oxide, or amorphous silicon, but there is no particular restriction.

In the pattern producing method, in a case where imprint lithography is performed using the curable composition for imprinting, mold pressure is preferably set to 10 atm or less. By setting the mold pressure to 10 atm or less, the mold or the substrate is less likely to be deformed and thus the pattern accuracy tends to be improved. Moreover, also from the viewpoint that a device tends to be reduced in size due to a low pressing force, the above range is preferable. The mold pressure is preferably selected from a range in which the residual film of the curable composition for imprinting corresponding to a projection part of the mold is reduced while uniformity of mold transfer can be ensured.

In addition, it is also preferable that the contact between the curable composition for imprinting and the mold is performed under an atmosphere containing a helium gas, a condensable gas, or both a helium gas and a condensable gas.

<<Light Irradiation Step>>

In the light irradiation step, the curable composition for imprinting is irradiated with light to form a cured product. An irradiation dose of light irradiation in the light irradiation step may be sufficiently larger than the minimum irradiation dose required for curing. The irradiation dose required for curing is appropriately determined by examining consumption of an unsaturated bond of the curable composition for imprinting or the like.

A kind of light to be radiated is not particularly specified, but ultraviolet light is exemplified.

In addition, in the imprint lithography applied to the present invention, a temperature of the substrate during light irradiation is usually room temperature, but in order to increase reactivity, light irradiation may be performed while heating. Since setting a vacuum state as a stage prior to the light irradiation is effective in preventing bubbles from being mixed, suppressing a decrease in reactivity due to oxygen mixing, and improving adhesiveness between the mold and the curable composition for imprinting, the light irradiation may be performed in a vacuum state. Moreover, in the pattern producing method, a preferred degree of vacuum during the light irradiation is in a range of $10^{-1}$ Pa to normal pressure.

During exposure, exposure illuminance is preferably in a range of 1 to 500 $mW/cm^2$ and more preferably in a range of 10 to 400 $mW/cm^2$. An exposure time is not particularly limited, but is preferably 0.01 to 10 seconds and more preferably 0.5 to 1 second. An exposure dose is preferably in a range of 5 to 1,000 $mJ/cm^2$ and more preferably in a range of 10 to 500 $mJ/cm^2$.

In the pattern producing method, after the film-like curable composition for imprinting (pattern forming layer) is cured by the light irradiation, as necessary, a step of applying heat to the cured pattern to further cure the pattern may be included. A temperature for heating and curing the curable composition for imprinting after the light irradiation is preferably 150° C. to 280° C. and more preferably 200° C. to 250° C. Moreover, a time for applying heat is preferably 5 to 60 minutes and more preferably 15 to 45 minutes.

<<Release Step>>

In the release step, the cured product and the mold are separated from each other (FIG. 1E). The obtained pattern can be used for various uses as described later.

That is, the present invention discloses a laminate further having the pattern formed of the curable composition for imprinting, on the surface of the underlayer film. Moreover, a thickness of the pattern forming layer consisting of the curable composition for imprinting used in the present invention varies depending on intended uses, but is about 0.01 μm to 30 μm.

Furthermore, as described later, etching or the like can also be performed.

<Pattern and Application Thereof>

As described above, the pattern formed by the pattern producing method can be used as a permanent film used in a liquid crystal display device (LCD) or the like, or an etching resist (mask for lithography) for manufacturing a semiconductor element. In particular, the present specification discloses a method for manufacturing a semiconductor element (circuit board), which includes the pattern producing method according to the preferred embodiment of the present invention. The method for manufacturing a semiconductor element according to the preferred embodiment of the present invention may further include a step of performing etching or ion implantation on the substrate using the pattern obtained by the pattern producing method as a mask and a step of forming an electronic member. That is, the present specification discloses a method for manufacturing a semiconductor element, which includes the pattern producing method. Moreover, the present specification discloses a method for manufacturing electronic equipment, which includes a step of obtaining a semiconductor element by the method for manufacturing a semiconductor element and a step of connecting the semiconductor element and a control mechanism for controlling the semiconductor element.

In addition, a grid pattern is formed on a glass substrate of the liquid crystal display device using the pattern formed by the pattern producing method, and thus a polarizing plate having low reflection or absorption and a large screen size (for example, 55 inches, or greater than 60 inches) can be manufactured at low cost. For example, the polarizing plate described in JP2015-132825A or WO2011/132649A can be manufactured.

The pattern formed in the present invention is also useful as an etching resist (mask for lithography) as shown in FIGS. 1F and 1G. In a case where the pattern is used as an etching resist, first, a fine pattern of, for example, a nano or micron order is formed on the substrate by the pattern producing method. In the present invention, the pattern producing method is particularly advantageous in that a fine pattern of a nano order can be formed, and a pattern having a size of 50 nm or less and particularly 30 nm or less can also be formed. The lower limit value of the size of the pattern formed by the pattern producing method is not particularly specified, but can be, for example, 1 nm or greater.

Furthermore, the present invention also discloses a method for manufacturing a mold for imprinting, which includes a step of obtaining a pattern on the substrate by the pattern producing method according to the preferred embodiment of the present invention and a step of etching the substrate using the obtained pattern.

By performing etching with an etching gas such as hydrogen fluoride or the like in a case of wet etching and $CF_4$ or the like in a case of dry etching, a desired pattern can be formed on the substrate. The pattern has favorable etching resistance particularly to dry etching. That is, the pattern formed by the pattern producing method is preferably used as a mask for lithography.

Specifically, the pattern formed in the present invention can be preferably used for producing a recording medium such as a magnetic disc, a light-receiving element such as a solid-state imaging element, a light emitting element such as a light emitting diode (LED) and organic electroluminescence (organic EL), an optical device such as a liquid crystal display device (LCD), an optical component such as a diffraction grating, a relief hologram, an optical waveguide, an optical filter, and a microlens array, a member for flat panel display such as a thin film transistor, an organic transistor, a color filter, an antireflection film, a polarizing plate, a polarizing element, an optical film, and a column material, a nanobiodevice, an immunoassay chip, a deoxyribonucleic acid (DNA) separation chip, a microreactor, a photonic liquid crystal, or a guide pattern for fine pattern formation (directed self-assembly, DSA) using self-assembly of block copolymers.

EXAMPLES

Hereinafter, the present invention will be described in more detail with reference to Examples. The materials, the used amounts, the ratios, the treatment details, the treatment procedures, and the like shown in the following Examples can be appropriately modified without departing from the spirit of the present invention. Therefore, the scope of the present invention is not limited to the specific examples described below. The Examples were carried out under a condition of 23° C., unless otherwise specified.

<Preparation of Composition for Forming Underlayer Film for Imprinting>

Raw materials were formulated and mixed so as to satisfy each of formulation ratios shown in Tables 2 to 5 below. After the mixing, the composition for forming an underlayer film for imprinting was transferred to a tank in a filtration device, and filtered with each filter shown in Tables 2 to 5 below. All filters used were capsule-type filters (effective filtration area of 700 $cm^2$). The filtration was performed while filling the tank with dry nitrogen so that the internal pressure of the tank in the filtration device was 0.1 MPa. In a case where a plurality of filters were used, the filtration was performed in the order of filtration filters (1) to (6). A temperature at that time was 23° C. Moreover, the filtration was performed in a clean room satisfying Class 1 (Class 3 in ISO 14644-1:2015) of Federal Specifications and Standards (Fed. Std. 209E).

After 5 L of an initial flow of filtrate was discarded, a perfluoroalkoxy alkane (PFA)-made bottle, which had been subjected to an acid cleaning treatment, was filled with the composition for forming an underlayer film for imprinting.

Furthermore, in some Examples, circulation filtration was performed by providing a pipe for returning the chemical liquid, which had been subjected to the filtration with the filter, to the filtration tank again. A liquid feeding pump was used during the circulation filtration.

<Evaluation of Productivity>

A time (minutes) required for filtering 1 L of the composition for forming an underlayer film for imprinting was used as an index of productivity, and evaluated as follows.

A: Required time≤4 minutes

B: 4 minutes<required time≤7 minutes

C: 7 minutes<required time≤10 minutes

D: Required time>10 minutes

<Production of Underlayer Film and Measurement of Film Thickness>

A silicon wafer having a thickness of 300 mm was spin-coated with the composition for forming an underlayer film for imprinting at a rotation speed of 1,500 rpm, and heated for 1 minute using a hot plate at 220° C. to form an underlayer film. A thickness of the underlayer film was measured by an ellipsometer.

Furthermore, in Comparative Example 6, Example 6, and Example 7, an underlayer film of Example 17 was formed under the aforementioned conditions, and then underlayer films were formed on a surface thereof according to the aforementioned conditions using compositions for forming an underlayer film for imprinting shown in Tables 2 to 5. Regarding Comparative Example 6, Example 6, and Example 7, the thicknesses of underlayer films excluding the thickness of the underlayer film of Example 17 were measured.

<Measurement of Concentration of Particulate Metal Including Metal>

A concentration of a particulate metal including a metal in the composition for forming an underlayer film for imprinting was measured using ICP-MS.

Specifically, ICP-MS ("Agilent 8800 TRIPLE QUADRUPOLE ICP-MS (for semiconductor analysis, option #200)") was used. As the sample introduction system, a quartz torch, a coaxial perfluoroalkoxy alkane (PFA) nebulizer (for self-priming), and a platinum interface cone were used.

Measurement parameters of a cool plasma condition are as follows.

A content of a particulate metal of 10 nm or larger was calculated from the particle diameter distribution of the metal particulate metal obtained by the measurement. The unit was ppt by mass or ppb by mass.

The measured metals were Na, K, Ca, Fe, Cu, Mg, Mn, Al, Li, Cr, Ni, Sn, Zn, As, Au, Ag, Cd, Co, Pb, Ti, V, and W.

Output of radio frequency (RF): 600 W

Flow rate of carrier gas: 0.7 L/min

Flow rate of make-up gas: 1 L/min

Sampling depth: 18 mm

<Measurement of Defects (Particles)>

The number of defects having a maximum length of 19 nm or greater, which were present on the entire surface of the wafer on which the underlayer film was formed, was measured using a wafer inspection device and a fully automatic defect review classifying device. The defects having a maximum length of 19 nm or greater refers to defects having a length of the longest portion of greater than 19 nm.

After the measurement with the wafer inspection device, the shapes of the defect were observed with the fully automatic defect review classifying device, and defects (particles placed on the film, which are called fall-on defects), which were apparently caused by the wafer before coating and the external environment, were subtracted from the number of defects.

As the wafer inspection device, a wafer inspection device "SP-5" manufactured by KLA-Tencor Corporation was used. As the fully automatic defect review classifying device, a fully automatic defect review classifying device "SEMVision G6" manufactured by Applied Materials, Inc. was used.

A: Number of defects≤50 defects/wafer

B: 50 defects/wafer<number of defects≤200 defects/wafer

C: 200 defects/wafer<number of defects≤500 defects/wafer

D: Number of defects>500 defects/wafer

<Evaluation of Imprint Defects>

As the quartz mold, a quartz mold having a hole pattern, which had 40 nm (hole diameter) and a pitch of 80 nm and was arranged in a lattice form, was used.

The curable composition for imprinting was applied onto the underlayer film obtained above by the ink jet method, and then sandwiched using the mold under a helium atmosphere. After exposure was performed from the quartz mold side using a high-pressure mercury lamp under a condition of 100 mJ/cm$^2$, the quartz mold was released to obtain a pattern.

The sample was introduced into the wafer inspection device and the defect review classifying device, and the number (defect density (DD), the unit was defects/cm$^2$) of defects was checked.

The results are shown below.

A: DD<1 defect/cm$^2$

B: 1 defect/cm$^2$≤DD<100 defects/cm$^2$

C: 100 defects/cm$^2$≤DD<1,000 defects/cm$^2$

D: DD≥1,000 defects/cm$^2$

<Evaluation of Etching Defects>

The underlayer film produced above was introduced into an etching device (Centura-DPS manufactured by Applied Materials, Inc.), the sample was introduced into the etching device (Centura-DPS manufactured by Applied Materials, Inc.), and etching (1) and etching (2) were continuously performed in this order under the following conditions. The obtained etching pattern was observed with a scanning electron microscope (SEM), and the number (defect density (DD), the unit was defects/cm$^2$) of defects was checked.

(Etching Conditions)

TABLE 1

| | Etching (1) | Etching (2) |
|---|---|---|
| Source | 50 W | 50 W |
| Bias | 50 W | 50 W |
| Pressure | 10 mTorr | 10 mTorr |
| Substrate temperature | 40° C. | 40° C. |
| $CHF_3$ | — | 20 sccm |
| $O_2$ | 20 sccm | 20 sccm |
| Ar | — | 30 sccm |
| Etching time | 30 sec | 60 sec |

The results are shown below.

A: DD<1 defect/cm$^2$

B: 1 defect/cm$^2$≤DD<100 defects/cm$^2$

C: 100 defects/cm$^2$≤DD<1,000 defects/cm$^2$

D: DD≥1,000 defects/cm$^2$

<Evaluation of Mold Durability>

As the quartz mold, a quartz mold with a line/space having a line width of 20 nm and a depth of 55 nm was used. Coordinates of 500 places in the quartz mold where defects (mask defects) did not exist were grasped in advance using a mask defect review scanning electron microscope (SEM) device E5610 (manufactured by ADVANTEST CORPORATION).

A curable composition for imprinting shown in Table 9 was applied onto the underlayer film produced above by the ink jet method using an ink jet printer DMP-2831 manufactured by FUJIFILM Dimatix Inc., and then sandwiched using the mold under a helium atmosphere. After exposure was performed from the quartz mold side using a high-pressure mercury lamp under a condition of 100 mJ/cm$^2$, the quartz mold was released to obtain a pattern.

This imprint process was repeated 100 times, then the quartz mold was recovered, and it was checked whether or not defects in the quartz mold were generated at the 500 places.

A: The generation of defects in the quartz mold was not observed

B: The number of places where defects in the quartz mold were observed was less than 5

C: The number of places where defects in the quartz mold were observed was 5 or more and less than 25

D: The number of places where defects in the quartz mold were observed was 25 or more The results of Comparative Examples and Examples are shown below.

TABLE 2

| | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| A-1 | 0.250 | | | | | | 0.250 |
| A-2 | | 0.300 | | | | | |
| A-3 | | | 0.200 | | | | |
| A-4 | | | | 0.300 | | | |
| A-5 | | | | | 0.250 | | |
| B-1 | | | | | | 0.300 | |
| B-2 | | | | | | | |
| B-3 | | | | | | | |
| B-4 | | | | | | | |
| B-5 | | | | 0.099 | | | |
| B-6 | | | | 0.001 | | | |
| C-1 | 99.750 | 99.750 | 70.000 | 99.600 | 70.000 | | 99.750 |
| C-2 | | | | | 10.000 | 99.700 | |
| C-3 | | | 29.800 | | 19.750 | | |
| C-4 | | | | | | | |
| Concentration of solid content | 0.250 | 0.300 | 0.200 | 0.400 | 0.250 | 0.300 | 0.250 |
| Filtration filter (1) | — | — | — | — | — | — | F-5 |
| Filtration filter (2) | — | — | — | — | — | — | — |
| Filtration filter (3) | — | — | — | — | — | — | — |
| Filtration filter (4) | — | — | — | — | — | — | — |
| Filtration filter (5) | — | — | — | — | — | — | — |
| Filtration filter (6) | — | — | — | — | — | — | — |
| Circulation filtration | — | — | — | — | — | — | — |
| Fe | 7.150 | 5.150 | 15.523 | 8.310 | 11.911 | 4.140 | 6.910 |
| Cu | 3.750 | 2.752 | 5.814 | 3.911 | 4.885 | 2.811 | 3.351 |
| Ti | 1.912 | 2.455 | 2.791 | 3.333 | 2.801 | 2.550 | 1.884 |
| Pb | 0.711 | 0.871 | 0.840 | 0.510 | 0.500 | 0.810 | 0.710 |
| Zn | 4.211 | 3.291 | 5.501 | 3.321 | 5.931 | 4.319 | 4.410 |
| Na | 10.900 | 10.311 | 17.500 | 12.100 | 33.500 | 9.100 | 10.812 |
| K | 7.944 | 9.901 | 22.134 | 8.901 | 10.900 | 3.100 | 7.710 |
| Ca | 3.291 | 2.104 | 6.810 | 3.111 | 8.900 | 2.800 | 3.224 |
| Mg | 0.112 | 1.113 | 0.519 | 0.335 | 0.990 | 0.001 | 0.040 |
| Mn | 0.121 | 0.511 | 0.411 | 0.255 | 0.311 | 0.001 | 0.071 |
| Li | 0.001 | 0.001 | 0.001 | 0.001 | 0.001 | 0.001 | 0.001 |
| Cr | 0.223 | 0.331 | 0.815 | 0.311 | 0.891 | 0.001 | 0.101 |
| Ni | 0.001 | 0.001 | 0.001 | 0.001 | 0.001 | 0.001 | 0.001 |
| Sn | 0.511 | 0.128 | 0.911 | 0.719 | 0.810 | 0.001 | 0.227 |
| As | 0.001 | 0.001 | 0.001 | 0.001 | 0.001 | 0.001 | 0.001 |
| Au | 0.001 | 0.001 | 0.001 | 0.001 | 0.001 | 0.001 | 0.001 |
| Ag | 0.001 | 0.001 | 0.001 | 0.001 | 0.001 | 0.001 | 0.001 |
| Cd | 0.001 | 0.001 | 0.001 | 0.001 | 0.001 | 0.001 | 0.001 |
| Co | 0.311 | 0.419 | 0.555 | 0.366 | 0.557 | 0.001 | 0.219 |
| Al | 1.910 | 2.921 | 4.130 | 2.114 | 6.300 | 1.001 | 1.905 |
| V | 0.001 | 0.001 | 0.001 | 0.001 | 0.001 | 0.001 | 0.001 |
| W | 0.001 | 0.001 | 0.001 | 0.001 | 0.001 | 0.001 | 0.001 |
| Evaluation of productivity (filtration rate) | — | — | — | — | — | — | A |
| Film thickness (nm) | 5.0 | 8.0 | 3.5 | 10.9 | 5.0 | 9.0 | 5.0 |
| Concentration of specific particle (ppb by mass) | 13.523 | 11.228 | 24.968 | 16.064 | 20.097 | 10.311 | 12.855 |
| Concentration of particle including metal other than specific particle (ppb by mass) | 43.065 | 42.266 | 84.262 | 47.605 | 89.195 | 30.644 | 41.582 |
| Evaluation of defects (particles) | D | D | D | D | D | D | C |
| Evaluation of imprint defects | D | D | D | D | D | D | D |

TABLE 2-continued

| | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Evaluation of etching defects | D | D | D | D | D | D | C |
| Evaluation of mold durability | D | D | D | D | D | D | D |

TABLE 3

| | Comparative Example 8 | Comparative Example 9 | Example 1 | Example 2 | Example 3 | Example 4 | Example 5 |
|---|---|---|---|---|---|---|---|
| A-1 | 0.250 | 0.250 | 0.250 | | | | |
| A-2 | | | | 0.300 | | | |
| A-3 | | | | | 0.200 | | |
| A-4 | | | | | | 0.400 | |
| A-5 | | | | | | | 0.250 |
| B-1 | | | | | | | |
| B-2 | | | | | | | |
| B-3 | | | | | | | |
| B-4 | | | | | | | |
| B-5 | | | | | | | |
| B-6 | | | | | | | |
| C-1 | 99.750 | 99.750 | 99.750 | 99.700 | 70.000 | 99.600 | 70.000 |
| C-2 | | | | | | | 10.000 |
| C-3 | | | | | 29.800 | | 19.750 |
| C-4 | | | | | | | |
| Concentration of solid content | 0.250 | 0.250 | 0.250 | 0.300 | 0.200 | 0.400 | 0.250 |
| Filtration filter (1) | F-8 | F-6 | F-10 | F-10 | F-10 | F-10 | F-10 |
| Filtration filter (2) | — | — | — | — | — | — | — |
| Filtration filter (3) | — | — | — | — | — | — | — |
| Filtration filter (4) | — | — | — | — | — | — | — |
| Filtration filter (5) | — | — | — | — | — | — | — |
| Filtration filter (6) | — | — | — | — | — | — | — |
| Circulation filtration | — | — | — | — | — | — | — |
| Fe | 6.011 | 6.801 | 3.112 | 2.910 | 5.510 | 3.110 | 5.510 |
| Cu | 2.330 | 3.030 | 1.131 | 0.910 | 1.810 | 1.510 | 2.011 |
| Ti | 1.510 | 1.810 | 0.712 | 1.010 | 1.910 | 1.910 | 2.014 |
| Pb | 0.700 | 0.700 | 0.211 | 0.315 | 0.500 | 0.250 | 0.401 |
| Zn | 4.200 | 4.391 | 0.310 | 0.291 | 5.500 | 0.561 | 3.100 |
| Na | 9.810 | 10.800 | 5.111 | 5.510 | 17.500 | 5.900 | 13.100 |
| K | 6.811 | 7.615 | 3.841 | 4.410 | 22.400 | 3.810 | 4.101 |
| Ca | 3.390 | 3.111 | 1.414 | 1.010 | 6.800 | 2.800 | 0.414 |
| Mg | 0.081 | 0.055 | 0.001 | 0.401 | 0.519 | 0.301 | 0.321 |
| Mn | 0.111 | 0.081 | 0.010 | 0.010 | 0.411 | 0.154 | 0.151 |
| Li | 0.001 | 0.001 | 0.001 | 0.001 | 0.001 | 0.001 | 0.001 |
| Cr | 0.221 | 0.081 | 0.101 | 0.121 | 0.815 | 0.311 | 0.411 |
| Ni | 0.001 | 0.001 | 0.001 | 0.001 | 0.001 | 0.001 | 0.001 |
| Sn | 0.331 | 0.227 | 0.151 | 0.050 | 0.911 | 0.411 | 0.431 |
| As | 0.001 | 0.001 | 0.001 | 0.001 | 0.001 | 0.001 | 0.001 |
| Au | 0.001 | 0.001 | 0.001 | 0.001 | 0.001 | 0.001 | 0.001 |
| Ag | 0.001 | 0.001 | 0.001 | 0.001 | 0.001 | 0.001 | 0.001 |
| Cd | 0.001 | 0.001 | 0.001 | 0.001 | 0.001 | 0.001 | 0.001 |
| Co | 0.281 | 0.219 | 0.281 | 0.281 | 0.555 | 0.219 | 0.257 |
| Al | 1.890 | 1.891 | 1.010 | 1.810 | 4.130 | 2.710 | 3.310 |
| V | 0.001 | 0.001 | 0.001 | 0.001 | 0.001 | 0.001 | 0.001 |
| W | 0.001 | 0.001 | 0.001 | 0.001 | 0.001 | 0.001 | 0.001 |
| Evaluation of productivity (filtration rate) | A | D | D | D | D | D | D |
| Film thickness (nm) | 5.0 | 5.0 | 5.0 | 7.8 | 4.1 | 12.3 | 5.3 |
| Concentration of specific particle (ppb by mass) | 10.551 | 12.341 | 5.166 | 5.145 | 9.730 | 6.780 | 9.936 |
| Concentration of particle including metal other than specific particle (ppb by mass) | 37.685 | 40.820 | 17.404 | 19.047 | 69.279 | 23.965 | 35.540 |
| Evaluation of defects (particles) | D | B | B | B | B | B | B |
| Evaluation of imprint defects | C | C | B | B | B | B | B |
| Evaluation of etching defects | C | C | A | A | B | A | B |
| Evaluation of mold durability | C | D | B | B | B | B | B |

TABLE 4

| | Example 6 | Example 7 | Example 8 | Example 9 | Example 10 | Example 11 | Example 12 |
|---|---|---|---|---|---|---|---|
| A-1 | | | 0.250 | 0.250 | 0.250 | 0.250 | 0.200 |
| A-2 | | | | | | | |
| A-3 | | | | | | | |
| A-4 | | | | | | | |
| A-5 | | | | | | | |
| B-1 | 0.300 | | | | | | |
| B-2 | | 0.300 | | | | | |
| B-3 | | | | | | | 0.050 |
| B-4 | | | | | | | |
| B-5 | | | | | | | |
| B-6 | | | | | | | |
| C-1 | | 99.700 | 99.750 | 99.750 | 99.750 | 99.750 | 89.750 |
| C-2 | 99.700 | | | | | | 10.000 |
| C-3 | | | | | | | |
| C-4 | | | | | | | |
| Concentration of solid content | 0.300 | 0.300 | 0.250 | 0.250 | 0.250 | 0.250 | 0.250 |
| Filtration filter (1) | F-10 | F-3 | F-1 | F-6 | F-5 | F-4 | F-5 |
| Filtration filter (2) | — | F-9 | F-10 | F-10 | F-12 | F-14 | F-15 |
| Filtration filter (3) | — | F-12 | — | — | — | — | — |
| Filtration filter (4) | — | — | — | — | — | — | — |
| Filtration filter (5) | — | — | — | — | — | — | — |
| Filtration filter (6) | — | — | — | — | — | — | — |
| Circulation filtration | — | — | — | — | — | — | — |
| Fe | 2.101 | 1.010 | 2.911 | 0.912 | 5.311 | 2.310 | 0.611 |
| Cu | 1.119 | 0.900 | 1.011 | 0.710 | 2.230 | 0.910 | 0.255 |
| Ti | 1.211 | 1.010 | 0.619 | 0.491 | 1.451 | 0.519 | 0.131 |
| Pb | 0.211 | 0.133 | 0.201 | 0.010 | 0.700 | 0.222 | 0.091 |
| Zn | 2.010 | 1.001 | 0.219 | 0.191 | 3.310 | 0.220 | 0.081 |
| Na | 3.190 | 2.101 | 4.811 | 1.911 | 8.310 | 2.110 | 0.711 |
| K | 1.021 | 0.611 | 2.201 | 0.911 | 6.910 | 1.010 | 0.281 |
| Ca | 1.030 | 0.811 | 1.001 | 0.487 | 3.810 | 0.713 | 0.232 |
| Mg | 0.001 | 0.031 | 0.001 | 0.001 | 0.101 | 0.081 | 0.055 |
| Mn | 0.001 | 0.023 | 0.021 | 0.011 | 0.091 | 0.022 | 0.033 |
| Li | 0.001 | 0.001 | 0.001 | 0.001 | 0.001 | 0.001 | 0.001 |
| Cr | 0.001 | 0.009 | 0.101 | 0.001 | 0.231 | 0.101 | 0.029 |
| Ni | 0.001 | 0.001 | 0.001 | 0.001 | 0.001 | 0.001 | 0.001 |
| Sn | 0.001 | 0.111 | 0.101 | 0.051 | 0.322 | 0.201 | 0.089 |
| As | 0.001 | 0.001 | 0.001 | 0.001 | 0.001 | 0.001 | 0.001 |
| Au | 0.001 | 0.001 | 0.001 | 0.001 | 0.001 | 0.001 | 0.001 |
| Ag | 0.001 | 0.001 | 0.001 | 0.001 | 0.001 | 0.001 | 0.001 |
| Cd | 0.001 | 0.001 | 0.001 | 0.001 | 0.001 | 0.001 | 0.001 |
| Co | 0.001 | 0.033 | 0.213 | 0.131 | 0.281 | 0.281 | 0.066 |
| Al | 0.710 | 0.511 | 0.911 | 0.058 | 1.990 | 0.999 | 0.087 |
| V | 0.001 | 0.001 | 0.001 | 0.001 | 0.001 | 0.001 | 0.001 |
| W | 0.001 | 0.001 | 0.001 | 0.001 | 0.001 | 0.001 | 0.001 |
| Evaluation of productivity (filtration rate) | D | A | B | D | B | A | A |
| Film thickness (nm) | 8.1 | 8.3 | 5.0 | 5.0 | 5.0 | 5.0 | 5.0 |
| Concentration of specific particle (ppb by mass) | 4.642 | 3.053 | 4.742 | 2.123 | 9.692 | 3.961 | 1.088 |
| Concentration of particle including metal other than specific particle (ppb by mass) | 12.616 | 8.303 | 14.330 | 5.884 | 35.056 | 9.707 | 2.760 |
| Evaluation of defects (particles) | B | B | B | A | A | B | A |
| Evaluation of imprint defects | B | B | A | A | B | A | A |
| Evaluation of etching defects | B | B | A | A | B | A | A |
| Evaluation of mold durability | B | B | B | B | B | A | A |

TABLE 5

| | Example 13 | Example 14 | Example 15 | Example 16 | Example 17 | Comparative Example 10 |
|---|---|---|---|---|---|---|
| A-1 | 0.200 | | | | 0.150 | 0.250 |
| A-2 | | 0.250 | | | | |
| A-3 | | | 0.250 | | | |
| A-4 | | | | 0.300 | | |
| A-5 | | | | | | |
| B-1 | | | | | | |
| B-2 | | | | | | |
| B-3 | | | | | | |
| B-4 | 0.200 | | | | 0.100 | |
| B-5 | | | | 0.099 | | |
| B-6 | | | | 0.001 | | |
| C-1 | 99.600 | 99.750 | 70.000 | 99.600 | 99.750 | |
| C-2 | | | | | | |
| C-3 | | | 29.750 | | | |
| C-4 | | | | | | 99.750 |
| Concentration of solid content | 0.400 | 0.250 | 0.250 | 0.400 | 0.250 | 0.250 |
| Filtration filter (1) | F-11 | F-9 | F-9 | F-4 | F-11 | F-11 |
| Filtration filter (2) | F-13 | F-14 | F-10 | F-14 | F-6 | F-5 |
| Filtration filter (3) | — | F-12 | F-7 | F-15 | F-15 | F-14 |
| Filtration filter (4) | — | — | — | — | — | F-13 |
| Filtration filter (5) | — | — | — | — | — | F-15 |
| Filtration filter (6) | — | — | — | — | — | F-15 |
| Circulation filtration | ○ | — | — | — | ○ | ○ |
| Fe | 0.711 | 1.010 | 0.591 | 0.301 | 0.101 | 0.019 |
| Cu | 0.555 | 0.671 | 0.263 | 0.101 | 0.022 | 0.002 |
| Ti | 0.189 | 0.251 | 0.113 | 0.113 | 0.019 | 0.009 |
| Pb | 0.133 | 0.181 | 0.081 | 0.030 | 0.010 | 0.003 |
| Zn | 0.111 | 0.210 | 0.101 | 0.064 | 0.051 | 0.003 |
| Na | 0.884 | 0.911 | 0.633 | 0.411 | 0.098 | 0.010 |
| K | 0.456 | 0.511 | 0.251 | 0.080 | 0.039 | 0.007 |
| Ca | 0.299 | 0.326 | 0.256 | 0.050 | 0.050 | 0.008 |
| Mg | 0.066 | 0.081 | 0.051 | 0.010 | 0.010 | 0.007 |
| Mn | 0.031 | 0.021 | 0.021 | 0.018 | 0.011 | 0.001 |
| Li | 0.001 | 0.001 | 0.001 | 0.001 | 0.001 | 0.001 |
| Cr | 0.066 | 0.051 | 0.033 | 0.013 | 0.013 | 0.010 |
| Ni | 0.001 | 0.001 | 0.001 | 0.001 | 0.001 | 0.001 |
| Sn | 0.137 | 0.181 | 0.101 | 0.044 | 0.022 | 0.001 |
| As | 0.001 | 0.001 | 0.001 | 0.001 | 0.001 | 0.001 |
| Au | 0.001 | 0.001 | 0.001 | 0.001 | 0.001 | 0.001 |
| Ag | 0.001 | 0.001 | 0.001 | 0.001 | 0.001 | 0.001 |
| Cd | 0.001 | 0.001 | 0.001 | 0.001 | 0.001 | 0.001 |
| Co | 0.799 | 0.101 | 0.055 | 0.023 | 0.013 | 0.004 |
| Al | 0.333 | 0.520 | 0.051 | 0.051 | 0.022 | 0.007 |
| V | 0.001 | 0.001 | 0.001 | 0.001 | 0.001 | 0.001 |
| W | 0.001 | 0.001 | 0.001 | 0.001 | 0.001 | 0.001 |
| Evaluation of productivity (filtration rate) | A | A | B | A | A | D |
| Film thickness (nm) | 11.9 | 5.3 | 5.4 | 10.9 | 5.0 | 5.0 |
| Concentration of specific particle (ppb by mass) | 1.588 | 2.113 | 1.048 | 0.545 | 0.152 | 0.033 |
| Concentration of particle including metal other than specific particle (ppb by mass) | 4.778 | 5.034 | 2.609 | 1.317 | 0.489 | 0.099 |
| Evaluation of defects (particles) | A | A | A | A | A | A |
| Evaluation of imprint defects | A | A | A | A | A | A |
| Evaluation of etching defects | A | A | A | A | A | A |
| Evaluation of mold durability | A | B | A | A | A | C |

In Tables 2 to 5, the formulation amount of each component is parts by mass. Moreover, in Tables 2 to 5, the unit of the concentration of the solid content is % by mass.
As the respective components and filters, the following components and filters were used.
<Resin>
TABLE 6
A-1 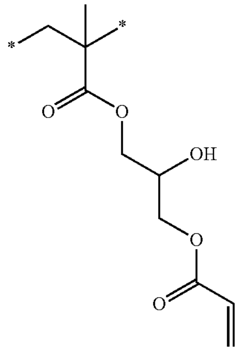 [SMILES: *CC(*)(C)C(=O)OCC(O)COC(=O)C=C]
A-2 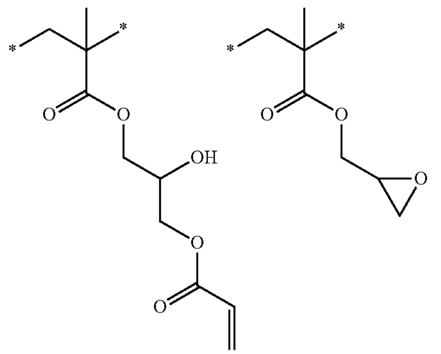 [SMILES: *CC(*)(C)C(=O)OCC(O)COC(=O)C=C ; *CC(*)(C)C(=O)OCC1CO1]
TABLE 6-continued
A-3 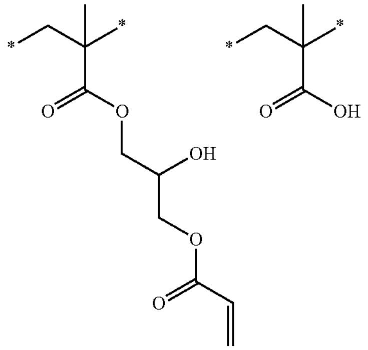
A-4 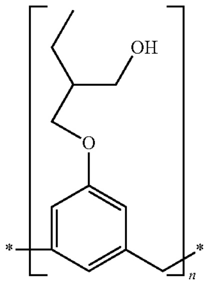
A-5 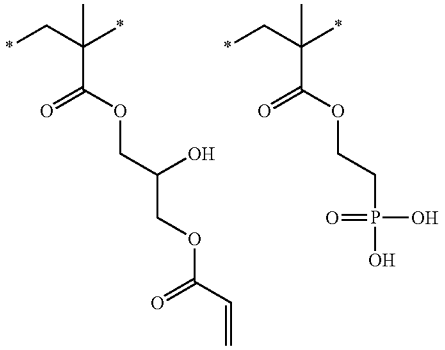 [SMILES: *CC(*)(C)C(=O)OCC(O)COC(=O)C=C ; *CC(*)(C)C(=O)OCCP(=O)(O)O]
In Table 6, n is 5 to 20.
<Other Components>
TABLE 7
B-1 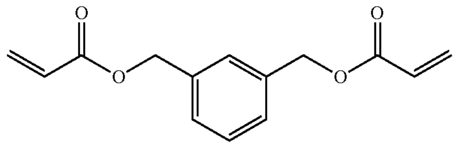 [SMILES: C=CC(=O)OCc1cccc(COC(=O)C=C)c1]
B-2 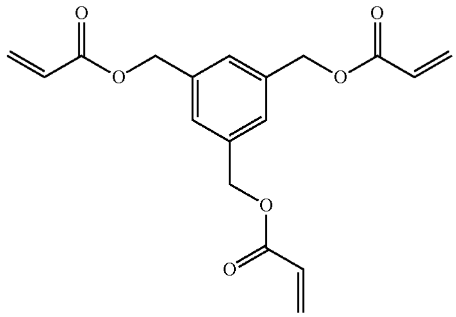 [SMILES: C=CC(=O)OCc1cc(COC(=O)C=C)cc(COC(=O)C=C)c1]

TABLE 7-continued
| | |
|---|---|
| B-3 | 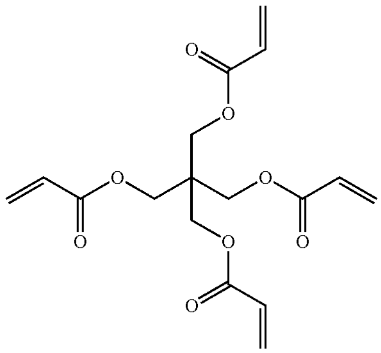 [SMILES: C=CC(=O)OCC(COC(=O)C=C)(COC(=O)C=C)COC(=O)C=C] |
| B-4 | 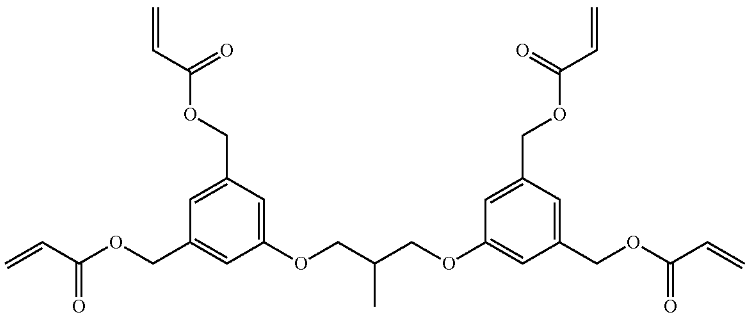 [SMILES: C=CC(=O)OCc1cc(COC(=O)C=C)cc(OCC(C)COc2cc(COC(=O)C=C)cc(COC(=O)C=C)c2)c1] |
| B-5 | 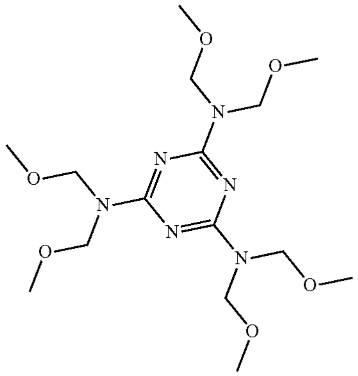 |
| B-6 | K-PURE TAG 2678 |
K-PURE TAG 2678 is a thermal acid generator produced by Kusumoto Chemicals, Ltd.
<Solvent>
TABLE 8
| | |
|---|---|
| C-1 | PGMEA |
| C-2 | PGME |
| C-3 | γ-Butyrolactone |
| C-4 | Distilled PGMEA |
PGMEA of C-4 is a distillation-purified grade product.
<Composition of Curable Composition for Imprinting>
TABLE 9
| Curable composition for imprinting | Formulation ratio |
|---|---|
| 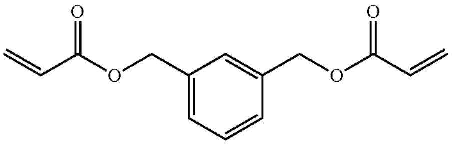 [SMILES: C=CC(=O)OCc1cccc(COC(=O)C=C)c1] | 65 |

TABLE 9-continued

| Curable composition for imprinting | Formulation ratio |
|---|---|
| 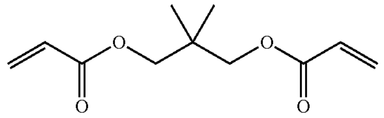 | 20 |
| 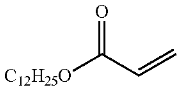 | 15 |
| 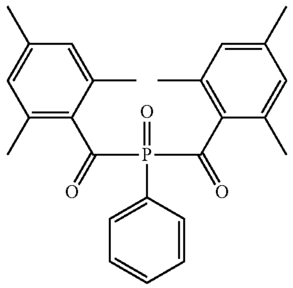 [SMILES: Cc1cc(C)c(C(=O)P(=O)(C(=O)c2c(C)cc(C)cc2C)c2ccccc2)c(C)c1] | 2 |
| 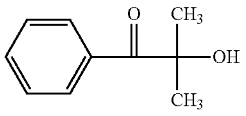 | 2 |
| 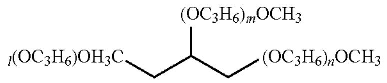 | 3 |

In Table 9, the formulation ratio is a mass ratio. 1+m+n is 7 to 12.

<Filter>

TABLE 10

| | Material of filter | Pore diameter |
|---|---|---|
| F-1 | HDPE | 150 nm |
| F-2 | UPE | 100 nm |
| F-3 | UPE | 50 nm |
| F-4 | UPE | 20 nm |
| F-5 | UPE | 10 nm |
| F-6 | UPE | 3 nm |
| F-7 | UPE | 0.9 nm |
| F-8 | Nylon | 20 nm |
| F-9 | Nylon | 15 nm |
| F-10 | Nylon | 3 nm |
| F-11 | PTFE | 20 nm |
| F-12 | PTFE | 3 nm |
| F-13 | Neutral group-grafted UPE | 5 nm |
| F-14 | Coated PTFE | 7 nm |
| F-15 | Nylon subjected to 1-day immersion cleaning with PGMEA | 1 nm |

HDPE is a high-density polyethylene filter.

UPE is ultra-high-molecular-weight polyethylene.

Nylon is a polyamide filter.

PTFE is polytetrafluoroethylene.

The neutral group-grafted UPE was produced according to the description in paragraphs 0058 and 0059 of JP2017-536232A. As the neutral group, a hydroxy group derived from hydroxymethyl acrylamide is included.

The coated PTFE is a material obtained by coating a PTFE porous film having a pore diameter of 7 nm with a coated resin, in which a carboxylic acid group is introduced into a side chain by a thiol-ene reaction between mercaptoacetic acid and an allyl group, according to the description in paragraphs 0018 to 0032, 0070, and 0071 of JP2017-002273A.

The Nylon subjected to 1-day immersion cleaning with PGMEA is a material cleaned by immersing a polyamide filter having a pore diameter of 1 nm in PGMEA for 1 day to remove elution components.

As is clear from Tables 3 to 5, the composition for forming an underlayer film for imprinting had excellent mold durability (Examples 1 to 17). In a case of forming an underlayer film, there were few defects (particles). The imprint pattern produced by using the underlayer film had few imprint defects. The underlayer film also had few etching defects. In a case where the filtration was performed with two or more kinds of filters having different pore diameters, the productivity was also excellent (Examples 7, 8, and 10 to 17).

Meanwhile, as is clear from Tables 2 and 3, the compositions of Comparative Examples had degraded mold durability (Comparative Examples 1 to 10). In a case of forming an underlayer film, there were many defects (particles). The imprint pattern produced by using the underlayer film had many imprint defects. The underlayer film also had many etching defects. The compositions of Comparative Examples also had degraded productivity.

EXPLANATION OF REFERENCES

1: Substrate

2: Underlayer film

3: Curable composition for imprinting

4: Mold

What is claimed is:

1. A composition for forming an underlayer film for imprinting, comprising:

a curable component; and a particulate metal which has a particle diameter of 10 nm or larger, as measured by a single particle ICP-MASS method, and contains at least one kind of iron, copper, titanium, or lead, wherein a content of the particulate metal is 152 ppt by mass to 10 ppb by mass with respect to the composition, and wherein the curable component includes a resin having at least one of constitutional units represented by Formulae (1) to (3):

(1)

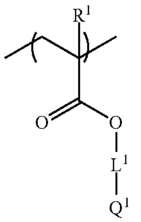

-continued (2)

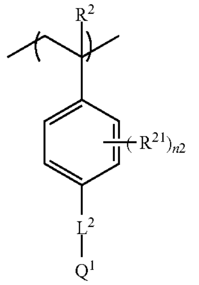

(3)

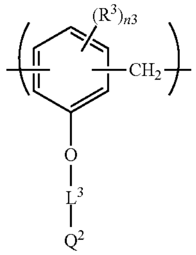

in the Formulae (1) to (3), $R^1$ and $R^2$ are each independently a hydrogen atom or a methyl group; $R^{21}$ and $R^3$ are each independently a substituent; $L^1$, $L^2$ and $L^3$ are each independently a single bond or a linking group; n2 is an integer of 0 to 4; n3 is an integer of 0 to 3; $Q^1$ is an ethylenically unsaturated group; and $Q^2$ is a polar group.

2. The composition for forming an underlayer film for imprinting according to claim 1, further comprising a particulate metal which is other than the aforementioned particulate metal, has a particle diameter of 10 nm or larger, as measured by the single particle ICP-MASS method, and contains at least one kind of sodium, potassium, calcium, magnesium, manganese, aluminum, lithium, chromium, nickel, tin, zinc, arsenic, silver, gold, cadmium, cobalt, vanadium, or tungsten, wherein a total amount of the particulate metal which has a particle diameter of 10 nm or larger, as measured by the single particle ICP-MASS method, and contains at least one kind of iron, copper, titanium, or lead and the particulate metal which is other than the aforementioned particulate metal, has a particle diameter of 10 nm or larger, as measured by the single particle ICP-MASS method, and contains at least one kind of sodium, potassium, calcium, magnesium, manganese, aluminum, lithium, chromium, nickel, tin, zinc, arsenic, silver, gold, cadmium, cobalt, vanadium, or tungsten is 100 ppt by mass to 30 ppb by mass with respect to the composition.

3. The composition for forming an underlayer film for imprinting according to claim 1, wherein the polar group is at least one kind of an alcoholic hydroxyl group, a phenolic hydroxyl group, or a carboxyl group.

4. The composition for forming an underlayer film for imprinting according to claim 1, wherein the polar group is a nonionic group.

5. The composition for forming an underlayer film for imprinting according to claim 1, wherein the ethylenically unsaturated group is a (meth) acryloyl group.

6. The composition for forming an underlayer film for imprinting according to claim 1, wherein the curable component includes a compound which is a liquid at 23° C.

7. The composition for forming an underlayer film for imprinting according to claim 6, wherein the compound which is a liquid at 23° C. has an ethylenically unsaturated group.

8. The composition for forming an underlayer film for imprinting according to claim 1, wherein the curable component includes a crosslinking agent.

9. The composition for forming an underlayer film for imprinting according to claim 1, further comprising a solvent.

10. The composition for forming an underlayer film for imprinting according to claim 1, wherein a concentration of a solid content is higher than 0% by mass and 1% by mass or lower.

11. A method for producing a composition for forming an underlayer film for imprinting, comprising:

mixing raw materials of the composition for forming an underlayer film for imprinting according to claim 1; and filtering the mixture with two or more kinds of filters thereafter, wherein pore diameters of at least two kinds among the two or more kinds of filters are different from each other.

12. The method for producing a composition for forming an underlayer film for imprinting according to claim 11, wherein materials of at least two kinds among the two or more kinds of filters are different from each other.

13. The method for producing a composition for forming an underlayer film for imprinting according to claim 11, wherein performing filtration by passing the composition for forming an underlayer film for imprinting through filters in order from a filter having a largest pore diameter among the two or more kinds of filters is included.

14. The method for producing a composition for forming an underlayer film for imprinting according to claim 11, wherein among the two or more kinds of filters, a pore diameter $X^1$ of a filter having a smallest pore diameter is 0.5 to 15 nm.

15. The method for producing a composition for forming an underlayer film for imprinting according to claim 11, wherein among the two or more kinds of filters, a pore diameter $X^2$ of a filter having a largest pore diameter is 5 to 100 nm.

16. The method for producing a composition for forming an underlayer film for imprinting according to claim 11, wherein among the two or more kinds of filters, at least one kind contains a resin having an adsorptive group capable of adsorbing at least one kind of iron, copper, titanium, or lead.

17. The method for producing a composition for forming an underlayer film for imprinting according to claim 16, wherein the resin having an adsorptive group is polyamide.

18. A pattern producing method comprising:

a step of applying the composition for forming an underlayer film for imprinting according to claim 1 to a substrate to form an underlayer film for imprinting;

a step of applying a curable composition for imprinting onto the underlayer film for imprinting;

a step of exposing the curable composition for imprinting in a state where a mold is in contact with the curable composition for imprinting; and a step of peeling off the mold.

19. The pattern producing method according to claim 18, wherein in the step of forming the underlayer film for imprinting, a spin coating method is used.

20. The pattern producing method according to claim 18, wherein the step of applying the curable composition for imprinting includes an ink jet method.

21. A method for manufacturing a semiconductor element, comprising the pattern producing method according to claim 18.

22. A cured product formed of the composition for forming an underlayer film for imprinting according to claim 1.

23. A kit comprising:

the composition for forming an underlayer film for imprinting according to claim 1; and a curable composition for imprinting that contains a polymerizable compound, and particulate metals which have a particle diameter of 10 nm or larger, as measured by a single particle ICP-MASS method, and contain at least one kind of iron, copper, titanium, or lead, wherein a content of the particulate metal is 100 ppt by mass to 30 ppb by mass with respect to a solid content of the curable composition for imprinting.

* * * * *